(12) United States Patent
Chirila et al.

(10) Patent No.: US 9,786,807 B2
(45) Date of Patent: Oct. 10, 2017

(54) THIN-FILM PHOTOVOLTAIC DEVICE AND FABRICATION METHOD

(75) Inventors: Adrian Chirila, Herznach (CH); Ayodhya Nath Tiwari, Zürich (CH); Patrick Bloesch, Oberwil Bei Büren (CH); Shiro Nishiwaki, Dübendorf (CH); David Bremaud, Uetikon am See (CH)

(73) Assignees: EMPA, Dubendorf (CH); FLISOM AG, Dubendorf (CH)

( * ) Notice: Subject to any disclaimer, the term of this patent is extended or adjusted under 35 U.S.C. 154(b) by 662 days.

(21) Appl. No.: 14/009,558

(22) PCT Filed: Apr. 17, 2012

(86) PCT No.: PCT/IB2012/051926
§ 371 (c)(1),
(2), (4) Date: Oct. 3, 2013

(87) PCT Pub. No.: WO2012/143858
PCT Pub. Date: Oct. 26, 2012

(65) Prior Publication Data
US 2014/0026956 A1    Jan. 30, 2014

(30) Foreign Application Priority Data
Apr. 19, 2011  (WO) ............... PCT/IB2011/000857

(51) Int. Cl.
*H01L 31/18*  (2006.01)
*H01L 21/02*  (2006.01)
(Continued)

(52) U.S. Cl.
CPC .......... *H01L 31/18* (2013.01); *H01L 21/0251* (2013.01); *H01L 21/02422* (2013.01);
(Continued)

(58) Field of Classification Search
CPC ............... H01L 31/18; H01L 31/0322; H01L 31/03928; H01L 21/02485
(Continued)

(56) References Cited

U.S. PATENT DOCUMENTS 4,332,880 A    6/1982  Izu et al.
4,335,266 A    6/1982  Mickelsen et al.
(Continued)

FOREIGN PATENT DOCUMENTS

DE    10259258 A1    7/2004
EP    743686 A2     11/1996
(Continued)

OTHER PUBLICATIONS

International Search Report for PCT/IB2012/051926, dated Oct. 31, 2012; ISA/EP.
(Continued)

*Primary Examiner* — Susan D Leong
(74) *Attorney, Agent, or Firm* — Patterson + Sheridan LLP

(57) ABSTRACT

A method to fabricate thin-film photovoltaic devices including a photovoltaic Cu(In,Ga)Se$_2$ or equivalent ABC absorber layer, such as an ABC$_2$ layer, deposited onto a back-contact layer characterized in that the method includes at least five deposition steps, during which the pair of third and fourth steps are sequentially repeatable, in the presence of at least one C element over one or more steps. In the first step at least one B element is deposited, followed in the second by deposition of A and B elements at a deposition rate ratio $A_r/B_r$, in the third at a ratio $A_r/B_r$ lower than the previous, in the fourth at a ratio $A_r/B_r$ higher than the previous, and in the fifth depositing only B elements to achieve a final ratio A/B of total deposited elements.

27 Claims, 6 Drawing Sheets

(51) Int. Cl.
*H01L 31/0256* (2006.01)
*H01L 31/032* (2006.01)
*H01L 31/0392* (2006.01)

(52) U.S. Cl.
CPC .. *H01L 21/02485* (2013.01); *H01L 21/02491* (2013.01); *H01L 21/02505* (2013.01); *H01L 21/02568* (2013.01); *H01L 31/0322* (2013.01); *H01L 31/03928* (2013.01); *Y02E 10/541* (2013.01)

(58) Field of Classification Search
USPC ............... 136/252, 256, 261, 262, 264, 265
See application file for complete search history.

(56) References Cited

U.S. PATENT DOCUMENTS

| | | |
|---|---|---|
| 4,465,575 A | 8/1984 | Love et al. |
| 4,961,829 A | 10/1990 | Mainzer et al. |
| 5,141,564 A | 8/1992 | Chen et al. |
| 5,441,897 A | 8/1995 | Noufi et al. |
| 6,092,669 A | 7/2000 | Kushiya et al. |
| 6,258,620 B1 | 7/2001 | Morel et al. |
| 6,441,301 B1 | 8/2002 | Satoh et al. |
| 7,785,921 B1 | 8/2010 | Juliano et al. |
| 7,989,256 B2 | 8/2011 | Hakuma et al. |
| 8,193,028 B2 | 6/2012 | Lee |
| 8,404,512 B1 | 3/2013 | Aksu et al. |
| 8,415,557 B2 | 4/2013 | Fukunaga et al. |
| 2002/0106873 A1* | 8/2002 | Beck ............. H01L 31/0322 438/482 |
| 2004/0063320 A1 | 4/2004 | Hollars |
| 2005/0202589 A1 | 9/2005 | Basol |
| 2006/0096635 A1 | 5/2006 | Tuttle |
| 2006/0145190 A1 | 7/2006 | Salzman et al. |
| 2008/0012006 A1 | 1/2008 | Bailey et al. |
| 2008/0023336 A1 | 1/2008 | Basol |
| 2008/0169025 A1 | 7/2008 | Basol et al. |
| 2008/0210295 A1 | 9/2008 | Basol |
| 2009/0092744 A1 | 4/2009 | Pinarbasi et al. |
| 2010/0229936 A1* | 9/2010 | Yago ............. H01L 31/18 136/256 |
| 2010/0248420 A1 | 9/2010 | Okamura et al. |
| 2010/0258191 A1 | 10/2010 | Mackie |
| 2011/0073186 A1 | 3/2011 | Lai et al. |
| 2011/0177645 A1 | 7/2011 | Vasquez et al. |
| 2011/0186102 A1 | 8/2011 | Kobayashi et al. |
| 2012/0006395 A1 | 1/2012 | Boussaad et al. |
| 2012/0064352 A1 | 3/2012 | Boussaad et al. |
| 2012/0080091 A1 | 4/2012 | Min et al. |
| 2012/0180870 A1 | 7/2012 | Yamamoto |
| 2012/0214293 A1 | 8/2012 | Aksu et al. |
| 2012/0258567 A1 | 10/2012 | Aksu et al. |
| 2012/0313200 A1 | 12/2012 | Jackrel et al. |
| 2013/0160831 A1 | 6/2013 | Zubeck et al. |

FOREIGN PATENT DOCUMENTS

| | | |
|---|---|---|
| EP | 787354 A1 | 8/1997 |
| EP | 826983 A1 | 3/1998 |
| EP | 1291932 A2 | 3/2003 |
| EP | 2309548 A2 | 4/2011 |
| EP | 2339641 A2 | 6/2011 |
| EP | 2408023 A1 | 1/2012 |
| EP | 2463929 A1 | 6/2012 |
| WO | 2006076788 A1 | 7/2006 |
| WO | WO-2007/072023 A1 | 6/2007 |
| WO | 2008088570 A1 | 7/2008 |
| WO | 2009076403 A1 | 6/2009 |
| WO | 2010/106534 A1 | 9/2010 |
| WO | 2011040645 A1 | 4/2011 |
| WO | 2012037242 A2 | 3/2012 |

OTHER PUBLICATIONS

Rudmann, D. (2004) Effects of sodium on growth and properties of Cu(In,Ga)Se2 thin films and solar cells, Doctoral dissertation, Swiss Federal Institute of Technology. Retrieved Sep. 17, 2012 from <URL: http://e-collection.ethbib.ethz.ch/eserv/eth:27376/eth-27376-02.pdf>.

Contreras et al. (1997) On the Role of Na and Modifications to Cu(In,Ga)Se2 Absorber Materials Using Thin-MF (M=Na, K, Cs) Precursor Layers, NREL/CP-520-22945.

Johnson et al. (2002) Interface Properties of Cigs(S)/Buffer Layers Formed by the Cd-Partial Electrolyte Process, 29 th IEEE PVSC, May 20-24, 2002.

Xu et al. (2011) A novel one-step electrodeposition to prepare single-phase CuInS 2 thin films for solar cells, Solar Energy Materials & Solar Cells 95 (2011) 791-796.

Zhang et al. (2003) Formation of CuInSe 2 and Cu(In,Ga)Se 2 films by electrodeposition and vacuum annealing treatment, Solar Energy Materials & Solar Cells 80 (2003) 483-490.

Chinese Office Action dated Aug. 19, 2015 for Application No. 201280012915.3.

Zribi, M. et al., "Optical Constants of Na-Doped CuInS2 Thin Films," Material Letters vol. 60, No. 1, Jan. 1, 2006, pp. 98-103.

Adrian Chirila, et al., "Potassium-Induced Surface Modification of Cu(In, Ga)Se2 Thin Films for High-Effeciency Solar Cells," Nature Materials, vol. 12. No. 12, Nov. 3, 2013, pp. 1107-1111.

Pyuck-Pa Choi, et al., "Compositional Gradients and Impurity Distributions in CuInSe2 Thin Film Solar Cells Studied by Atom Probe Tomography," Surface and Interface Analysis, vol. 44, No. 11-12, Nov. 18, 2012, pp. 1386-1388.

R. Wuerz et al. "CIGS Thin-Film Solar Cells and Modules on Enamelled Steel Substrates", Solar Energy Materials & Solar Cells. 2012.

Cojocaru-Miredin O., et al. "Exploring the P-N Junction Region Oin Cu(In,Ga) Sethin-Film Solar Cells at the Nanmeter-Scale," Applied Physics Letters, American Institute of Physics, US, vol. 101, No. 18, Oct. 29, 2012, pp. 181603-3.

Hunger, R., et al., "Removal of the Surface Investion of CuInSe2 Absorbers by NH3, aq Etchings," Proceedings of the 3rd World Conference on Photovoltaic Energy Conversion: Joint Conference of 13th Science & Engineering Conference, 30th IEEE PV Specialists Conference, 18th European PV Solar Energy Conference, May 18, 2003, pp. 556-569.

Balboul, M.R., et al., "Sodium Induced Phase Segreations in CuGaSe2 and CuInSe2 Thin Films," 17th E.C. Photovoltaic Solar Energy Conferenc, Munich Germany, Oct. 22-26, 2001; Proceedings of the International Solar Energy Conference, Munich: WIP-Renewable Energies, DE vol. Conf. 17, Oct. 22, 2001, pp. 1015-1018.

* cited by examiner

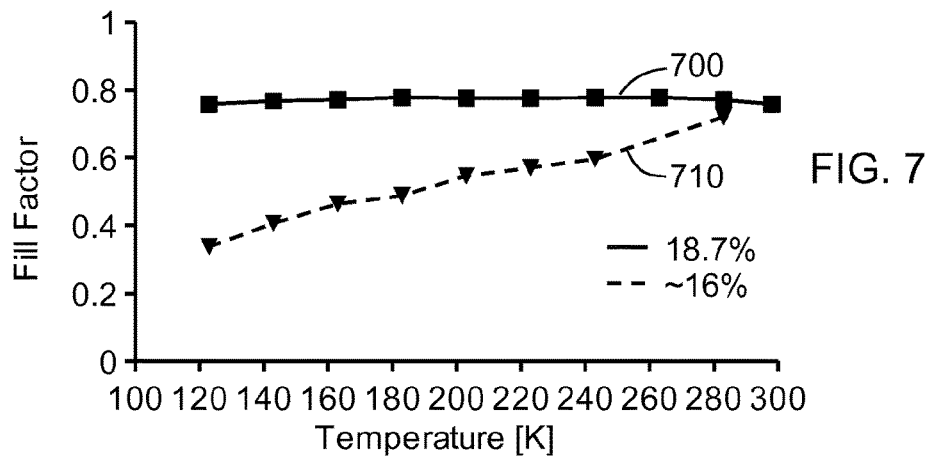
FIG. 7
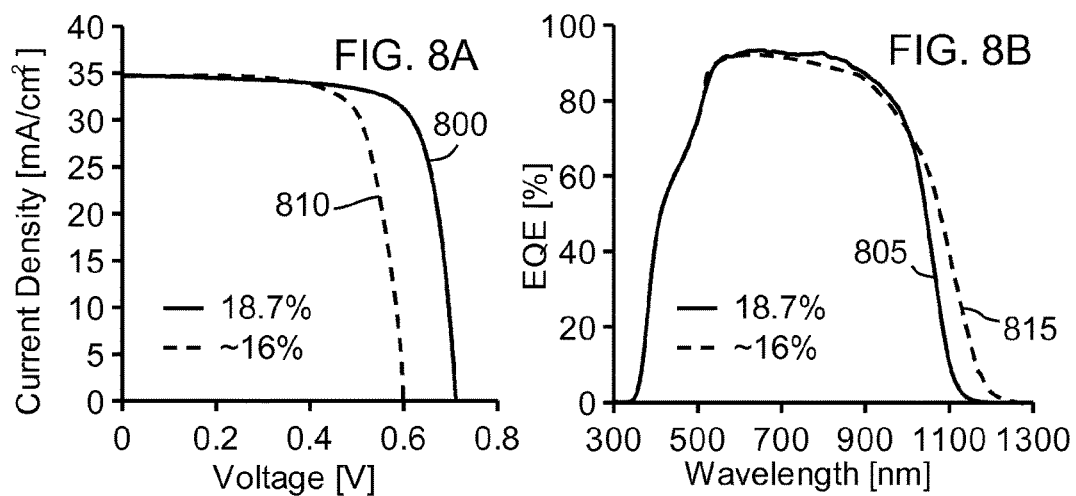
FIG. 8A
FIG. 8B
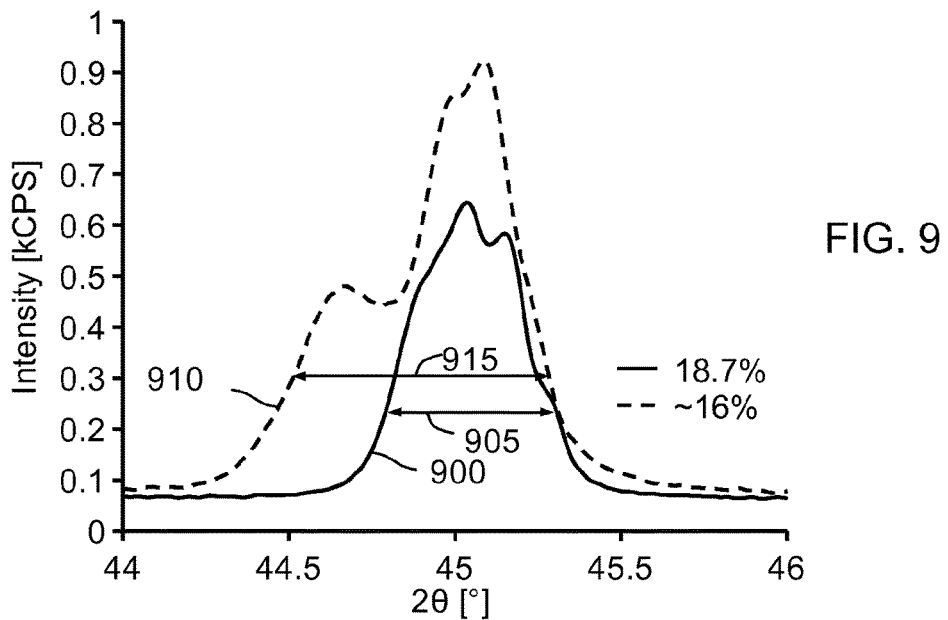
FIG. 9

THIN-FILM PHOTOVOLTAIC DEVICE AND FABRICATION METHOD

CROSS-REFERENCE TO RELATED APPLICATIONS

This application is a 371 U.S. National Stage of International Application No. PCT/IB2012/051926, filed Apr. 17, 2012, and claims priority to International Patent Application No. PCT/IB2011/000857, filed Apr. 19, 2011, the disclosures of which are herein incorporated by reference in their entirety.

FIELD OF THE INVENTION

The present invention relates to solar cells and/or photovoltaic devices manufactured by deposition of thin-films and more particularly to the depth distribution of elements in the absorber layer of chalcogenide semiconductors or ABC semiconductive compounds.

BACKGROUND OF THE INVENTION

Photovoltaic devices are generally understood as photovoltaic cells or photovoltaic modules. Photovoltaic modules ordinarily comprise arrays of interconnected photovoltaic cells.

A method to manufacture photovoltaic devices and/or photovoltaic cells includes for example slicing of semiconductor material into wafers. Another method to manufacture photovoltaic devices includes deposition of semiconductor material as a thin film onto a substrate. The manufacture of thin-film photovoltaic devices may be more cost efficient than that of photovoltaic devices from wafers. Increased cost efficiency is achieved not only thanks to material and energy savings during production but also to technological progress in increasing the devices' photovoltaic conversion efficiency. The present disclosure relates to the manufacture of thin-film photovoltaic devices using a relatively low cost and low substrate temperature method, said devices having a photovoltaic efficiency that is higher than that of prior art thin-film devices manufactured at similar substrate temperature levels. Reductions in costs of photovoltaic devices for a given electrical power output are a major driver to expand their commercialization and help reduce emissions resulting from fossil fuel combustion. Furthermore, increases in photovoltaic device conversion efficiency enable higher electrical power output per unit area and therefore lower material and installation costs for a given output power.

A thin-film photovoltaic device is ordinarily manufactured by depositing material layers onto a substrate. From a simplified functional viewpoint, the material layers can be represented as a photovoltaic absorber layer possibly coated by a buffer layer, the combination being sandwiched between at least two conductive layers. The present disclosure is concerned with photovoltaic devices containing an absorber layer generally based on an ABC chalcogenide material, such as an $ABC_2$ chalcopyrite material, wherein A represents elements in group 11 of the periodic table of chemical elements as defined by the International Union of Pure and Applied Chemistry including Cu or Ag, B represents elements in group 13 of the periodic table including In, Ga, or Al, and C represents elements in group 16 of the periodic table including S, Se, or Te. An example of an $ABC_2$ material is the $Cu(In,Ga)Se_2$ semiconductor also known as CIGS. The disclosure also concerns variations to the ordinary ternary ABC compositions, such as $Cu_xIn_ySe_z$ or $Cu_xGa_ySe_z$, in the form of quaternary, pentanary, or multinary materials such as $Cu_x(In,Ga)_y(Se,S)_z$, $Cu_x(In,Al)_ySe_z$, $Cu_x(Zn,Sn)_ySe_z$, $Cu_x(Zn,Sn)_y(Se,S)_z$, or $(Ag,Cu)(In,Ga)_ySe_z$.

The disclosure presents a method for production at relatively low substrate temperatures (below 600° C.) of photovoltaic devices. It is especially advantageous for the production of flexible photovoltaic devices based on plastic substrates or metal foils. The disclosure also presents devices with a novel characteristic depth distribution of semiconductor elements in the absorber layer.

The photovoltaic absorber layer of thin-film ABC or $ABC_2$ photovoltaic devices can be manufactured using a variety of methods such as vapor deposition, sputtering, printing, ion beam, or electroplating. The most common method is based on vapor deposition or co-evaporation within a vacuum chamber ordinarily using multiple material evaporation sources. U.S. Pat. No. 4,335,266 describes methods for forming thin-film solar cells from $I-III-VI_2$ chalcopyrite compounds and is considered generally as a landmark in the art of manufacturing $ABC_2$ photovoltaic devices. More recent prior art is presented in U.S. Pat. No. 5,441,897 which presents a method of fabricating $Cu(In,Ga)(Se,S)_2$ thin-film solar cells in two or three steps. U.S. Pat. No. 6,258,620 contributes further to the aforementioned three steps method by using different material atomic ratios at the beginning of the deposition process and possibly contributing more material deposition steps to compose a precursor layer that is thereafter converted into an absorber layer by heating deposited materials at a substantially higher substrate temperature.

Although some prior art has enabled the fabrication of photovoltaic devices whose conversion efficiency may be on par with the more conventional technology of silicon wafers, high efficiencies of thin-films have so far been obtained using high temperature deposition processes, typically around 600° C. This disclosure therefore describes a method that has the advantage of also enabling the manufacture of high efficiency photovoltaic devices at substantially lower deposition temperatures, typically between 350° C. and 550° C. The disclosure also describes the characteristics of such photovoltaic devices.

SUMMARY OF THE INVENTION

This invention presents solutions to the problem of manufacturing high efficiency thin-film photovoltaic devices, especially flexible photovoltaic devices, and more precisely devices manufactured at a relatively low substrate temperature such as below 600° C. In the following, ABC is used to represent ABC or $ABC_2$ semiconductor compounds in the form of ternary, quaternary, pentanary, or multinary materials.

An object of the invention is to provide methods that improve the manufacture of photovoltaic devices as well as the photovoltaic conversion efficiency of said devices, and the characterization of photovoltaic devices manufactured accordingly, as indicated in the following paragraphs.

A common problem in the field of thin-film photovoltaic devices manufactured by depositing an ABC semiconductor compound onto a substrate is that high temperatures around 600° C. are needed to produce devices that have photovoltaic conversion efficiencies that are high enough to rival that of devices based on silicon wafers. The higher the substrate temperature during thin-film deposition, the greater the energy required. It is therefore an object of the current invention to provide a method to manufacture ABC photovoltaic devices at lower temperatures and energy levels, said devices having photovoltaic conversion efficiencies that are not only comparable to thin-film devices manufactured at said high temperatures but also to devices based on silicon wafers.

Another problem in the field of thin-film photovoltaic device manufacturing, and more specifically in the field of ABC thin-film photovoltaic device manufacturing, is that high temperature deposition processes restrict the variety of substrate materials onto which the ABC semiconductor may be deposited. The deposition process is therefore constrained to materials that will not deteriorate at said high temperatures over the duration of the process. It is therefore a further object of the current invention to provide a method to manufacture high efficiency ABC thin-film photovoltaic devices onto a wider variety of substrates, such as flexible plastic substrates. This becomes possible with the inventive method thanks to lower ABC semiconductor deposition temperatures between 350° C. and 550° C.

A further problem in the field of thin-film photovoltaic device manufacturing is that material from some substrates, such as metallic substrates, may contaminate the deposited semiconductor thin-film with substrate elements and impurities. A method to avoid this contamination is to coat the substrate with a barrier layer such as $Al_xO_y$, $Si_xN_y$, or $Si_xO_y$. Said barrier layer may nevertheless contain pinholes that will induce some residual contamination of the semiconductor thin-film. The occurrence of pinholes in the barrier layer is related to a substrate's roughness. Metallic substrates must ordinarily be subjected to surface treatment such as smoothing or polishing prior to coating with a barrier layer. Furthermore, the comparatively low temperatures of the inventive method during deposition lead to reductions in unwanted diffusion of impurities and may allow to eliminate the barrier layer deposition step from the process prior to deposition of the photovoltaic absorber layer. It is therefore a further object of the invention to avoid contamination, roughness difficulties, and costs of treatments associated with metallic substrates thanks to a relatively low-temperature (below 550° C.) deposition method that enables the use of non-contaminating and extremely smooth substrate materials such as plastic.

Yet another problem in the field of high efficiency photovoltaic module manufacturing is that modules are assembled from individual photovoltaic cells such as silicon cells or thin-film on glass cells. This assembly requires batch processing at several stages of the production line which, compared to roll-to-roll production techniques, is more expensive. Furthermore, because the highest efficiency thin-film devices are produced at high temperatures mostly on rigid glass substrates, they do not lend themselves well to roll-to-roll production. An advantage of metallic substrates used as continuous webs in roll-to-roll production is that they allow relatively high substrate temperatures (above 550° C.) during material deposition but at the expense of the previously mentioned surface treatment. It is therefore another object of the invention to provide a method that enables roll-to-roll manufacturing of high efficiency photovoltaic devices at low cost and low energy.

A particular object of the invention is to provide high efficiency solar devices thanks to improved photovoltaic absorber layer qualities and conversion characteristics, as indicated in the following paragraphs.

A common problem in the field of thin-film photovoltaic devices manufactured by depositing a chalcopyrite or chalcogenide semiconductor absorber layer onto a substrate is that defects and irregularities in the crystalline structure represented by crystal grain sizes and patterns in the photovoltaic semiconducting layer may degrade photovoltaic conversion. Said crystalline structure within the first micrometer of semiconductor layer thickness at the light exposed side is especially important for high photovoltaic conversion efficiency. Said defects and irregularities occur more frequently as a result of forming the semiconducting layer at low temperature. It is therefore an object of the current invention to provide solar devices that have crystalline structure in the approximately first micrometer of semiconductor layer thickness at the light exposed side that is desirable for high photovoltaic conversion efficiency despite being manufactured at relatively low temperature (below 550° C.).

Another problem in said field that results from the aforementioned problem is that electrical carriers may recombine within the semiconductor layer and therefore reduce the photovoltaic device's photovoltaic conversion efficiency. It is therefore another object of the invention to provide solar devices manufactured at low temperature that have less recombination of charge carriers and therefore a fill factor and open-circuit voltage that is comparable to that of photovoltaic devices manufactured at substantially higher temperatures, i.e. 600° C.

A further problem in said field is to design the depth distribution, or grading, of elements in the absorber layer so as to optimize the trade-off between generated current and voltage to maximize conversion efficiency. It is therefore a further object of the inventive method to provide a depth distribution, or grading, of elements in the absorber layer that results in high efficiency solar devices manufactured at low temperature (between 350° C. and 550° C.).

Yet another problem in said field is to obtain an absorber layer surface that matches the subsequently deposited layers. It is therefore another object of the inventive method to provide an absorber layer whose surface and interface properties such as smoothness and bandgap alignment match those of subsequently deposited layers.

Yet a further problem in said field is to design layers for thin-film photovoltaic devices where said layers have matched coefficients of thermal expansion. Matched coefficients of thermal expansion are an important factor for good layer adhesion, longevity, and sustained and long-lasting photovoltaic conversion efficiency, especially in the case of flexible photovoltaic device manufacturing. Furthermore, lower manufacturing temperatures may reduce problems associated with variations in coefficients of thermal expansion across a photovoltaic device's layers.

In brief, the invention pertains to a method to fabricate thin-film photovoltaic devices comprising a photovoltaic $Cu(In,Ga)Se_2$ or equivalent ABC or $ABC_2$ absorber layer deposited onto a back-contact layer, characterized in that said method comprises at least five deposition steps, wherein the pair of third and fourth steps are sequentially repeatable, in the presence of at least one C element over one or more steps. In the first step at least one B element is deposited, followed in the second by deposition of A and B elements at a deposition rate ratio $A_r/B_r$, in the third at a ratio $A_r/B_r$ lower than the previous, in the fourth at a ratio $A_r/B_r$ higher than the previous, and in the fifth depositing only B elements to achieve a final ratio A/B of total deposited elements. The resulting photovoltaic devices are characterized in that, starting from the light-exposed side, the absorber layer (130) of the photovoltaic devices (100) comprises a first region (501) of decreasing Ga/(Ga+In) ratio, followed by a second region (502) of increasing Ga/(Ga+In) ratio where over the light-exposed half side of the second region (502) the value of Ga/(Ga+In) increases by less than 0.20 and contains at least one hump.

In greater detail, the invention pertains to a method of fabricating at least one absorber layer for thin-film photovoltaic devices, which absorber layer is made of an ABC chalcogenide material, including ABC chalcogenide material quaternary, pentanary, or multinary variations, wherein A represents elements in group 11 of the periodic table of chemical elements as defined by the International Union of Pure and Applied Chemistry including Cu and Ag, B represents elements in group 13 of the periodic table including In, Ga, and Al, and C represents elements in group 16 of the periodic table including S, Se, and Te.

Said absorber layer is deposited onto a back-contact layer carried by a substrate.

The inventive method comprises the following sequential steps ($s_1$) to ($s_5$), wherein the two steps ($s_{3,r}$) and ($s_{4,r}$) are executed at least once and may be sequentially repeated from zero up to a number R times, where r is a repeat counting index having a value from 0 to R that identifies the successive steps ($s_{3,r}$) and ($s_{4,r}$), and where the temperature of the substrate from steps ($s_2$) to ($s_5$) is greater than 350° C. The sequential steps ($s_1$) to ($s_5$) are:

$s_1$. depositing at least one B element onto the back-contact layer of said substrate in an amount that is greater than 10% and less than 90% of the total amount of required B elements at the end of the deposition process, such deposition of the B element(s) being done in the presence of at least one C element;

$s_2$. depositing an initial amount of at least one A element in combination with at least one B element and in the presence of at least one C element, with a ratio $A_r/B_r$ of the atomic deposition rates of elements A and B such that:

$A_r/B_r>1$, and the atomic ratio A/B of the total deposited elements A and B at the end of step ($s_2$) is:

$$(1/(3+2R))^2 < A/B < 1.0;$$

$s_{3,r}$. depositing at least one A element in combination with at least one B element and in the presence of at least one C element, with a ratio $A_r/B_r$ of the atomic deposition rates of elements A and B such that:

$A_r/B_r$ is 1/1.2 times less than that of $A_r/B_r$ in the previous step, and the atomic ratio A/B of the total deposited elements A and B at the end of the step ($s_{3,r}$) is:

$$((2+2r)/(3+2R))^2 < A/B < 1+3((1+2r)/(2+2R))^{1/2};$$

$s_{4,r}$. depositing at least one A element in combination with at least one B element and in the presence of at least one C element, with a ratio $A_r/B_r$ of the atomic deposition rates of elements A and B such that:

$A_r/B_r$ is at least 1.2 times greater than that of $A_r/B_r$ in the previous step, and the atomic ratio A/B of the total deposited elements A and B at the end of the step ($s_{4,r}$) is:

$$((3+2r)/(3+2R))^2 < A/B < 1+3((1+r)/(1+R))^{1/2}; \text{ and}$$

$s_5$. depositing an additional amount of at least one B element in the presence of at least one C element onto the partially completed absorber layer, thereby changing the atomic ratio A/B of the total deposited elements A and B elements at the end of step ($s_5$) to:

$$0.6 < A/B < 0.99.$$

At least one C element is possibly added to the absorber layer before, between, or after any of steps ($s_1$), ($s_2$), ($s_{3,r}$), ($s_{4,r}$), and ($s_5$).

The substrate temperature is preferably greater than 350° C. and less than 550° C. for steps ($s_2$), ($s_{3,r}$), ($s_{4,r}$), and ($s_5$). Moreover, the substrate temperature where material is deposited in step ($s_1$) is preferably greater than 200° C. and less than 450° C., then increased during any of, or a combination of, steps ($s_2$), ($s_{3,r}$), and ($s_{4,r}$) to reach a temperature that is greater than 350° C. and less than 550° C. Preferably still, the substrate temperature where material is deposited in step ($s_1$) is at about 350° C., then increased in step ($s_2$) to reach a temperature that is about 450° C. in step ($s_{3,r}$), where r=0; and then maintained substantially constant until the end of steps ($s_{4,r}$) and ($s_5$), where r=R.

The method can be used to fabricate an ABC material where A represents element Cu, B represents elements In and/or Ga, and C represents element Se.

When the deposited B element(s) comprise Ga, the total amount of Ga deposited over steps ($s_2$), ($s_{3,r}$), and ($s_{4,r}$) is advantageously comprised between 10% and 50% of the total amount of Ga deposited over the entire process, and the total amount of Ga deposited over steps ($s_{3,r}$) is comprised between 10% and 25% of the total amount of Ga deposited over the entire process.

In some embodiments, the deposition steps ($s_1$) to ($s_5$) correspond to the following respective step sequence of material deposition rates within a ±20% margin:

$s_1$. depositing In at a rate of 3.5 Å/s and Ga starting at a rate of 1.1 Å/s and decreasing progressively to 0.95 Å/s;

$s_2$. depositing Cu at a rate of 2.1 Å/s, In at a rate of 0.15 Å/s, and Ga at a rate of 0.15 Å/s;

$s_{3,0}$. depositing Cu at a rate of 2.1 Å/s, In at a rate of 0.15 Å/s, and Ga at a rate of 0.6 Ns;

$s_{4,0}$. depositing Cu at a rate of 2.1 Å/s, In at a rate of 0.15 Å/s, and Ga at a rate of 0.15 Å/s; and $s_5$. depositing In at a rate of 0.9 Å/s and Ga starting at a rate of 0.35 Å/s and increasing progressively to 0.45 Å/s.

Sequential steps ($s_1$) to ($s_5$) can be followed by a further step where at least one B element is deposited in the presence of at least one C element at a temperature below 350° C. and such that a supplemental layer less than 100 nm thick is deposited.

Alkaline elements can be provided to said absorber layer by any of: said substrate, said back-contact layer, and/or an alkaline containing precursor that is deposited during and/or after the deposition of said absorber layer.

Another aspect of the invention is a thin-film photovoltaic device comprising at least one absorber layer obtainable by the method set forth above.

The invention also concerns a thin-film photovoltaic device comprising a flexible substrate and an absorber layer characterized in that said absorber layer is made of an ABC chalcogenide material as defined above, wherein said ABC chalcogenide material comprises In and Ga elements wherein a compositional analysis of substantially smoothed Ga/(Ga+In) ratio data across the thickness of said absorber layer forms a Ga/(Ga+In) ratio curve in which, starting from a light-exposed side of said absorber layer, said Ga/(Ga+In) ratio curve comprises at least two regions comprising:

a. a front grading region of decreasing Ga/(Ga+In) ratio where a light-exposed side of said front grading region has a Ga/(Ga+In) value that is less than 0.5 and where the amplitude of the Ga/(Ga+In) value in said front grading region is less than 0.25 and greater than 0.1;

b. a back grading region, adjacent to said front grading region and located between said front grading region and the back side of the absorber layer opposite the light-exposed side, of overall increasing Ga/(Ga+In) ratio where:
   (i) over the light-exposed half side of said back grading region the value of Ga/(Ga+In) increases by less than 0.20;
   (ii) the light-exposed half side of said back grading region comprises at least one hump of locally increased or decreased Ga/(Ga+In) ratio, said hump being enclosed by two inflection points in the Ga/(Ga+In) ratio curve (500).

In such a device the absorber layer typically comprises $Cu(In,Ga)Se_2$.

Also, the thickness of the absorber layer is preferably comprised between 0.5 μm to 4.0 μm.

In this device the fill factor defined as the product of voltage and current at maximum power point divided by the product of open-circuit voltage and short-circuit current is essentially constant between temperatures of 120 K and 300 K at a fill factor value greater than 0.60.

Moreover, the full width at quarter maximum measured from the base of a curve of X-ray diffraction intensity of the (220)/(240) reflections vs. 2θ scattering angle has a width of less than 0.6°. The X-ray diffraction system used here and in subsequent Examples is a Siemens D-5000 set in Bragg-Brentano mode with a step size of 0.02°, step time of 30 s, slit width of 1 mm, voltage of 40 kV, and current of 37 mA. The used lines are Cu K-alpha-1 and Cu K-alpha-2 with wavelengths of 1.54060 Å and 1.54439 Å, respectively.

The device can comprise a photovoltaic cell having a photovoltaic conversion efficiency greater than 16% under test conditions, known to a person skilled in the art as Standard Test Conditions, defined by an irradiance of 1,000 $W/m^2$, solar spectrum of AM 1.5G, and operating cell temperature of 25° C.

The device's substrate can be any of polyimide, coated polyimide, stainless steel, coated stainless steel, mild steel, coated mild steel, aluminium, coated aluminium, glass, or a ceramic material.

The invention's features advantageously solve several problems in the field of thin-film photovoltaic devices manufacturing, and more specifically manufacturing of the absorber layer of such devices, namely:

The multiple stage method comprising at least five stages enables the production of advantageous front- and back-graded ABC absorber layer compositions required for high efficiency photovoltaic devices. Said method advantageously details and brackets the compositional ratios required and provides two repeatable steps that advantageously guide fine adjustments of the method.

Said method is more specifically designed for relatively low deposition temperatures comprised between 350° C. and 550° C. and is therefore especially advantageous for deposition on materials such as plastics or flexible foils.

Said method comprises steps where the amount of Ga in the deposited B elements is increased with respect to the amount of In so as to advantageously create the required compositional grading required for the manufacture of high efficiency photovoltaic devices.

Said method advantageously details and brackets the material flux rates for an exemplary deposition sequence aimed at fabricating a high efficiency photovoltaic device at said relatively low deposition temperatures.

Said method also advantageously allows the deposition of a further B material layer that is less than 100 nm thick.

Said method will ordinarily be complemented with the addition of alkaline material originating from a variety of sources such as substrate, back-contact layer, or an alkaline precursor so as to advantageously increase the resulting device's photovoltaic conversion efficiency.

Said method may also be advantageously implemented within a roll-to-roll manufacturing apparatus where said substrate is mounted between a delivery roll and a take-up roll and will be placed for deposition with numerous advantageous productivity benefits.

The resulting thin-film photovoltaic device comprises a flexible substrate and an absorber layer made of an ABC chalcogenide material comprising In and Ga elements. Compositional analysis across the thickness of said absorber layer exhibits a Ga/(Ga+In) ratio curve that is advantageous for photovoltaic conversion efficiency in that it contains advantageous front- and a back-grading regions that evolve between given limits and where the back-grading region comprises at least one hump of locally increased or decreased Ga/(Ga+In) ratio.

Said device may advantageously comprise an absorber layer made of $Cu(In,Ga)Se_2$ Said device may advantageously be tested by a set of non-invasive analyses such as fill factor measurements over a range of operating temperatures comprised between 120 K and 300 K and X-ray diffraction intensity prior to proceeding to invasive measurements of the composition of the absorber layer in order to determine whether the device was manufactured according to said method.

Said device is especially advantageous in that it comprises at least one photovoltaic cell whose photovoltaic conversion efficiency is greater than 16% under test conditions defined by an irradiance of 1,000 $W/m^2$, solar spectrum of AM 1.5G, and cell temperature of 25° C.

Said device is advantageously manufactured onto a broad range of flexible or rigid substrates such as polyimide, coated polyimide, stainless steel, coated stainless steel, mild steel, coated mild steel, aluminium, coated aluminium, glass, or a ceramic material.

BRIEF DESCRIPTION OF FIGURES

Embodiments of the invention will now be described by way of example, with reference to the accompanying drawings, in which:

FIG. 7 is a graph enabling a comparison between two photovoltaic cells (~16% and 18.7% efficiency) of fill factor vs. operating temperature.

FIGS. 8A and 8B are graphs showing, respectively, current density vs. voltage and external quantum efficiency (EQE) as a function of illumination wavelength for 18.7% and about 16% efficiency photovoltaic cells operating at a temperature of 298 K.

FIG. 9 is a graph showing X-ray diffraction intensity of dominant reflections vs. scattering angle for two photovoltaic cells (~16% and 18.7% efficiency).

DETAILED DESCRIPTION OF SPECIFIC EMBODIMENTS

Figure 1:
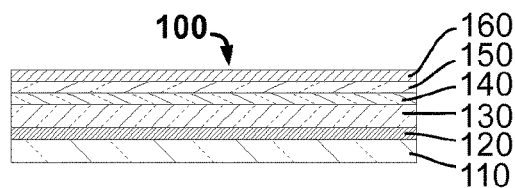
FIG. 1 presents a schematic cross-section of a photovoltaic cell depicting layers deposited onto a substrate.

Exemplary embodiments of photovoltaic cells having a cross-section similar to that presented in FIG. 1 are manufactured using the method presented in FIGS. 2 to 4. Exemplary embodiments of photovoltaic cells manufactured using the described inventive method exhibit a so-called material distribution signature. The material distribution signature is obtained by sampling the depth distribution of materials present in the photovoltaic absorber layer of the photovoltaic cell presented in FIG. 1. Exemplary material distribution signatures are presented in FIGS. 5A to 5C. Further photovoltaic properties are presented in FIGS. 6 to 9.

FIG. 1 presents the cross section of an embodiment of a photovoltaic cell or module 100. A sequence of material layers is deposited on a substrate 110. Substrate 110 may be rigid or flexible and be of a variety of materials or coated materials such as glass, coated metal, plastic-coated metal, plastic, or coated plastic such as metal-coated plastic. The inventive method as described is especially advantageous for materials exhibiting relatively low glass transition temperatures such as plastic. A preferred flexible substrate material could therefore be polyimide as it can sustain temperatures of about 350-550° C. Industrially available polyimide substrates are ordinarily available in thicknesses ranging from 7 µm to 150 µm. An exemplary sequence of material layer deposition follows. The order of this sequence may be reversed and also include scribing operations to delineate cell or module components. The purpose of this description is to clarify the context within which the absorber layer 130, the main subject of this invention, is deposited.

Substrate 110 is ordinarily coated with at least one electrically conductive layer 120. Said electrically conductive layer, or stack of electrically conductive layers, also known as the back-contact, may be of a variety of electrically conductive materials, preferably having a coefficient of thermal expansion (CTE) that is close both to that of the said substrate 110 onto which it is deposited and to that of other materials that are to be subsequently deposited upon it. Said conductive layer preferably has a high optical reflectance. Said conductive layer preferably does not react in a chemically destructive manner with other materials that are to be subsequently deposited upon it. In ordinary practice, layer 120 is deposited in a process such as sputtering, electrodeposition, chemical vapor deposition, physical vapor deposition, electron beam evaporation, or spraying and is commonly made of Mo although several other materials such as metal chalcogenides, molybdenum chalcogenides, $MoSe_x$, transition metal chalcogenides, tin-doped indium oxide (ITO), $In_xO_y$, $ZnO_x$, $ZrN_x$, $SnO_x$, $TiN_x$, Ti, W, Ta, and Nb may also be used or included advantageously.

In the next step at least one semiconductive photovoltaic layer 130, also known as the absorber layer, is deposited onto said back-contact. The method, composition, and structure of semiconductive photovoltaic layer 130 is the main object of this invention. Layer 130 is made of an ABC material, wherein A represents elements in group 11 of the periodic table of chemical elements as defined by the International Union of Pure and Applied Chemistry including Cu or Ag, B represents elements in group 13 of the periodic table including In, Ga, or Al, and C represents elements in group 16 of the periodic table including S, Se, or Te. An example of an $ABC_2$ material is the $Cu(In,Ga)Se_2$ semiconductor also known as CIGS. Layer 130 may be deposited using a variety of techniques such as sputtering, electrodeposition, printing, or as a preferred technique, vapor deposition. Layer 130 has a thickness ordinarily comprised between 1 µm and 4 µm but may even be as thin as 0.5 µm.

The subsequent steps ordinarily include the deposition of two layer stacks of substantially transparent layers. A first layer stack ordinarily includes at least one so-called semiconductive buffer layer 140, ordinarily with an energy bandgap higher than 1.7 eV, for example made of CdS, $In_xS_y$, $ZnS_x$, $GaSe_x$, $In_xSe_y$, $SnO_x$, $ZnO_x$, or Zn(O,S) material. A second layer stack ordinarily includes a front-contact conductive oxide (TCO) layer 150, for example made of materials such as doped indium oxide, doped gallium oxide, or doped zinc oxide. Further optional steps include the deposition of front-contact metallized grid traces 160 to advantageously augment front-contact conductivity followed by anti-reflective coating ordinarily provided either as a deposited layer or as an encapsulating film.

Figure 2A:
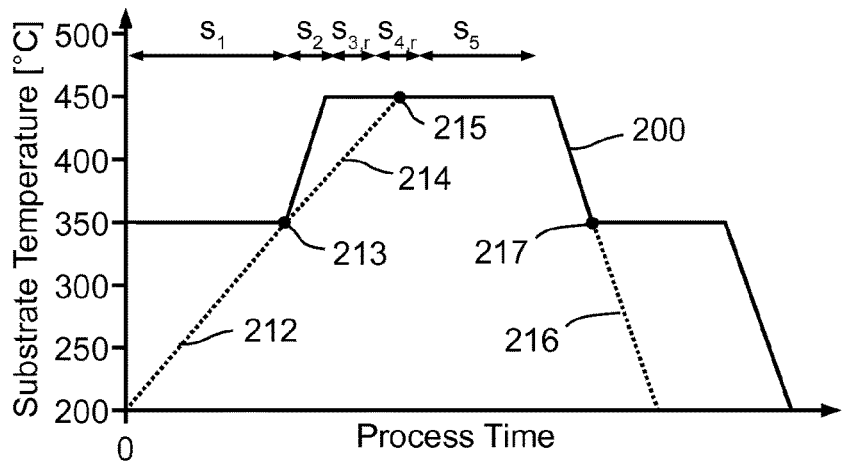
FIGS. 2A to 2C are conceptual graphs of substrate temperatures and relative deposition rates during the material deposition process to manufacture a range of photovoltaic cell embodiments.
Figure 2B:
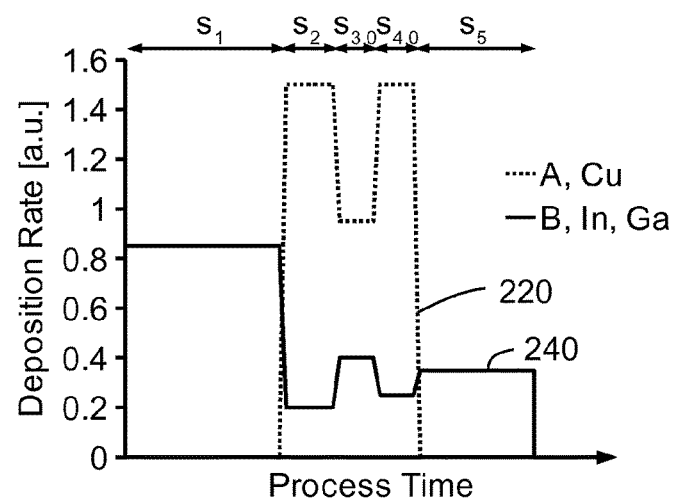
Figure 2C:
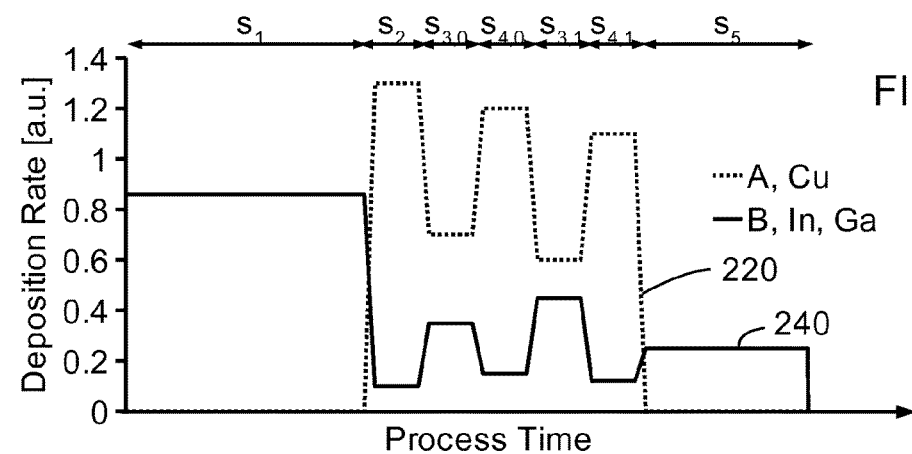
Figure 3A:
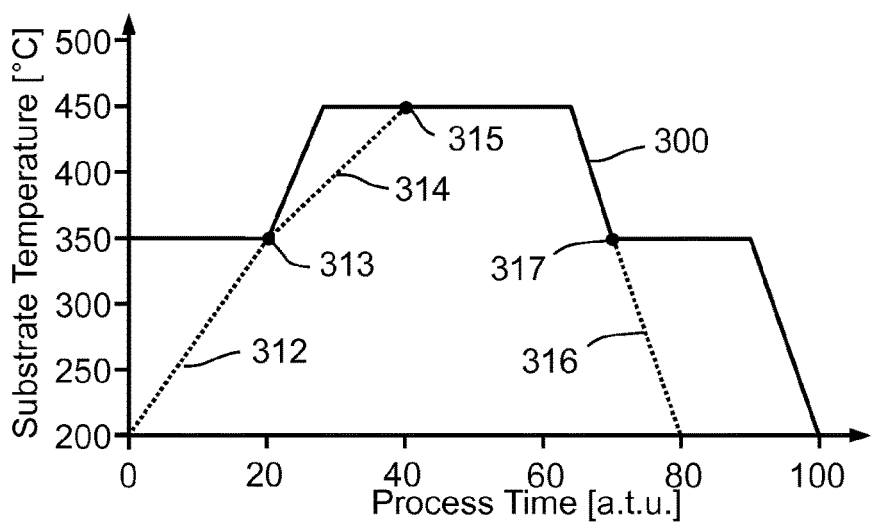
FIGS. 3A to 3C are exemplary graphs of substrate temperatures (3A) and material deposition rates (3B,3C) during the material deposition process to manufacture a photovoltaic cell embodiment.
Figure 3B:
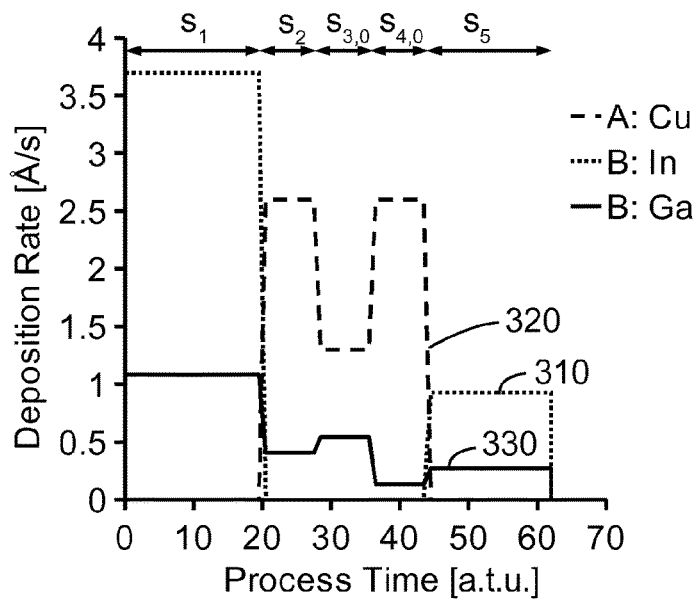
Figure 3C:
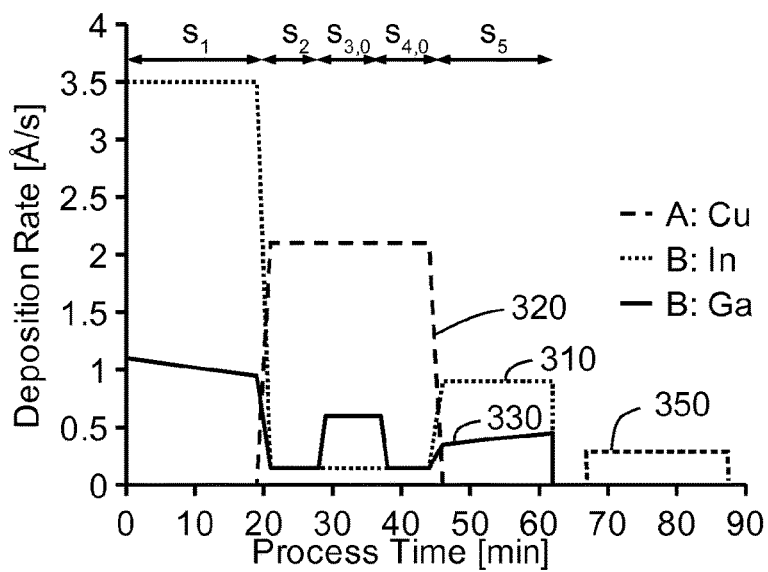
Figure 4A:
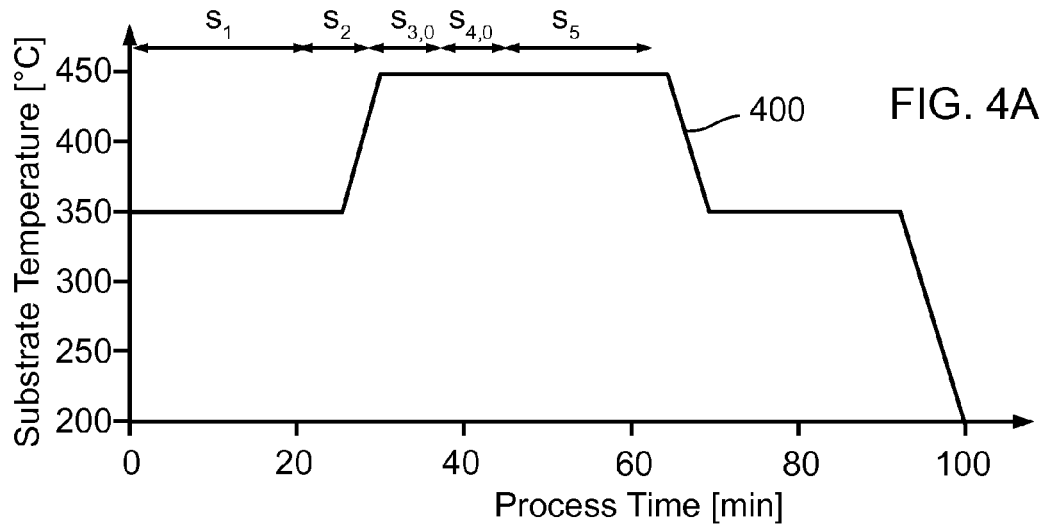
FIGS. 4A to 4B are a second set of exemplary graphs respectively of substrate temperatures and material deposition rates during the material deposition process to manufacture a first exemplary photovoltaic cell embodiment.
Figure 4B:
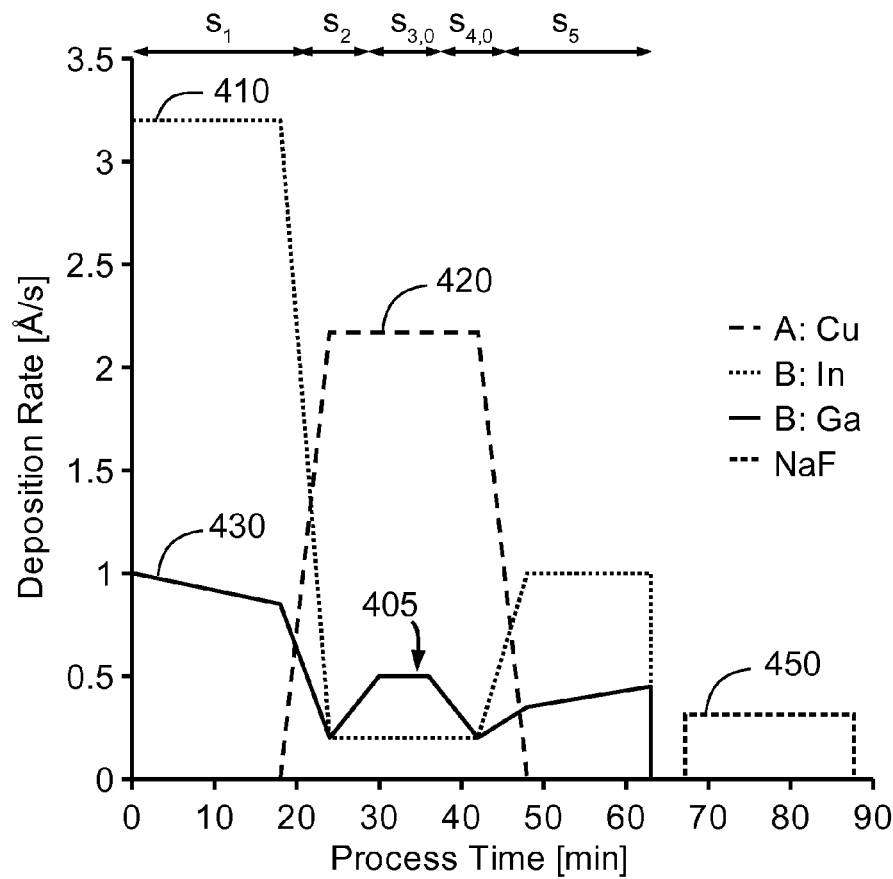

FIGS. 2A to 4B are graphs of substrate temperature and material deposition rates during the photovoltaic absorber layer deposition stage to manufacture four photovoltaic cell embodiments. FIGS. 2A to 2C are conceptual graphs that do not specify durations at each step $(s_1)$, $(s_2)$, $(s_{3,r})$, $(s_{4,r})$, $(s_5)$ of the deposition process. In practice, especially in the context of an industrial process, a person skilled in the art will infer that the process duration may for example be substantially shortened by increasing the material deposition rates or reducing the overall thickness of photovoltaic absorber layer 130. The timings provided in FIGS. 3A, 3B, 4A, 4B for each deposition step may therefore be shortened or lengthened depending on the deposition rates achievable by the deposition system or to manufacture a photovoltaic absorber layer that corresponds to the method's specifications. FIGS. 4A and 4B is an illustrative example of the baseline process enabling a person skilled in the art and with appropriate equipment to manufacture solar cells and modules with a photovoltaic conversion efficiency that may be greater than 16%.

The sequence of temperatures and relative material deposition rates that form the ABC material of layer 130 is depicted in FIGS. 2A to 2C. FIG. 2A is a graph of substrate temperatures during the material deposition process to manufacture semiconductive photovoltaic absorber layer 130 for a range of photovoltaic cell embodiments. FIG. 2B is a corresponding graph of relative deposition rates during the material deposition process to manufacture a range of photovoltaic cell embodiments. Substrate temperatures are ordinarily held at about the temperatures indicated by the preferred values of continuous plot 200 and, for some parts of the process, at temperatures greater than the lower values described by dashed segments 212 and 214. Sections ($s_1$), ($s_2$), ($s_{3,r}$), ($s_{4,r}$), ($s_5$) enable a comparison of timings in FIG. 2A with steps ($s_1$), ($s_2$), ($s_{3,0}$), ($s_{4,0}$), ($s_5$) in the baseline process of FIG. 2B and ($s_1$), ($s_2$), ($s_{3,0}$), ($s_{4,0}$), ($s_{3,1}$), ($s_{4,1}$), ($s_5$) where steps ($s_{3,r}$), ($s_{4,r}$) are repeated once in FIG. 2C. Prior to deposition of semiconductive photovoltaic layer 130, substrate 110 will have ordinarily been coated with back-contact layer 120. Substrate 110 with its back-contact layer 120 is then preferably heated for the deposition of semiconductive photovoltaic layer 130 to begin.

Deposition rate values in FIGS. 2B and 2C are in arbitrary units (a.u.) such that for materials A and B deposited over a deposition period T at a rate of 1 one obtains a stoichiometric atomic ratio of A/B=1. For example, for a Cu(In,Ga) deposition one obtains Cu/(In+Ga)=1. Not shown in FIGS. 2B, 2C, and 3B is the deposition rate of material C which, in the context of a Cu(In,Ga) deposition, would preferably be Se material. The flux rate of material C is ordinarily kept constant during the entire deposition process at a rate ordinarily greater than 2, preferably about 5, and ordinarily less than 100 in said arbitrary units. Not shown in FIGS. 2B and 2C is the deposition rate of one or more so-called dopant alkaline precursor material such as NaF, NaCl, NaSe, KF, KCl, CsF, and LiF. This omission is due to the fact that said dopant may be added continuously or in stages or may originate from the substrate, a precursor layer, or another deposition source.

Deposition is conducted in successive steps ($s_1$), ($s_2$), ($s_{3,r}$), ($s_{4,r}$), ($s_5$), where steps ($s_3$) and ($s_4$) are repeated up to a number R times and where r is an index counting from zero to R that identifies each step ($s_3$) and ($s_4$) by its number. In FIG. 2B R=0 and in FIG. 2C R=1. Omitting some details, the deposition steps can be summarized as:

$s_1$. Deposition of semiconductive photovoltaic layer 130 starts with the deposition of at least one B material. Deposition during this step may be conducted at a temperature less than or equal to a most preferred temperature of about 350° C. If the starting temperature is below the most preferred temperature of 350° C., the starting minimum is about 150° C., preferably 200° C., and must increase, for example linearly according to segment 212, to reach 350° C. at the end of step ($s_1$) as marked by point 213.

$s_2$. Material A is added and the deposition rate of materials B is reduced. Step ($s_2$) starts from point 213 where the temperature is increased to reach about 450° C. and at least the temperature according to linear segment 214. Segment 214 extends from point 213 to point 215 where the temperature is about 450° C. The abscissa of point 215 is located within the time allocated for step ($s_{4,0}$) in FIG. 2B or ($s_{4,1}$) in FIG. 2C. A person skilled in the art will determine that point 215 is located before the end of step ($s_{4,0}$) or ($s_{4,1}$) so as to allow enough time for materials to react and form the desired crystal phases.

$s_{3,r}$. Materials A and B are deposited with a ratio $A_r/B_r$ of deposition rates of elements A and B such that, among other constraints, $A_r/B_r$ is less than 1/1.2 times (~0.83 times) that in the previous step, whether the previous step is ($s_2$) or ($s_{4,r}$).

$s_{4,r}$. Materials A and B are deposited with a ratio $A_r/B_r$ of deposition rates of elements A and B such that, among other aforementioned constraints, $A_r/B_r$ is greater than 1.2 times that in the previous step and greater than 1.

$s_5$. Material B is deposited until the atomic ratio of deposited A elements to deposited B elements is such that 0.6<A/B<0.99.

Steps ($s_1$) to ($s_5$) are done in the presence of at least one C element which may also be present before, between, and after these steps.

Following step ($s_5$) temperature is decreased until point 217 where temperature reaches 350° C. Two possibilities exist from point 217: 1) if sufficient amounts of alkaline elements were provided to absorber layer 130 during any of steps ($s_1$), ($s_2$), ($s_{3,r}$), ($s_{4,r}$), ($s_5$) using a variety of methods such as via substrate 110, back-contact layer 120, and/or an alkaline containing precursor that is deposited during and/or after the deposition of absorber layer 130, then the temperature may continue to be decreased to 200° C. and below, or 2) if no or insufficient amounts of alkaline elements were provided to absorber layer 130 then the temperature is maintained at 350° C. for a period of time that a person ordinarily skilled in the art will estimate to enable provision of a sufficient amount of alkaline elements to absorber layer 130, after that temperature may be decreased to 200° C. and below.

The disclosure therefore presents to the person skilled in the art an advantageous method comprising at least 5 steps to manufacture the absorber layer 130 of high efficiency photovoltaic devices 100 at relatively low substrate temperatures (below 550° C.). Said method is especially advantageous in that it provides guidelines that are independent to some extent of deposition process and absolute deposition rates, therefore enabling longer or shorter deposition processes.

Tables 1 and 2 list the sequence of material atomic deposition rates (in arbitrary units) for the successive exemplary stages depicted in FIGS. 2B and 2C, respectively.

TABLE 1

Material deposition stages and deposition rates of FIG. 2B

| Step | Material Deposition Rate [a.u.] | |
|---|---|---|
| | A | B |
| $s_1$ | 0 | 0.85 |
| $s_2$ | 1.5 | 0.2 |
| $s_{3,0}$ | 0.95 | 0.4 |
| $s_{4,0}$ | 1.5 | 0.25 |
| $s_5$ | 0 | 0.35 |

TABLE 2

Material deposition stages and deposition rates of FIG. 2C

| Step | Material Deposition Rate [a.u.] | |
|---|---|---|
| | A | B |
| $s_1$ | 0 | 0.86 |
| $s_2$ | 1.3 | 0.1 |
| $s_{3,0}$ | 0.7 | 0.35 |
| $s_{4,0}$ | 1.2 | 0.15 |
| $s_{3,1}$ | 0.6 | 0.45 |
| $s_{4,1}$ | 1.1 | 0.12 |
| $s_5$ | 0 | 0.25 |

Not shown in FIGS. 2A to 2B and subsequent FIGS. 3A to 4B is that the deposition may optionally be followed by the deposition of a supplemental layer of at least one B element in the presence of at least one C element at a temperature below 350° C. and such that the deposited supplemental layer is less than 100 nm thick. This supplemental layer may act as said semiconductive buffer layer 140 and may be composed as $(In_{1-x}Ga_x)_2Se_3$ where x is ordinarily about 0.3.

FIGS. 3A to 3C show two deposition examples and enable a comparison of timings for temperature and material deposition steps over a given deposition process. The duration of steps ($s_1$) to ($s_5$) is represented at the top of the graphs in FIGS. 3B and 3C.

FIG. 3A is a graph of substrate temperatures 300 during the material deposition process to manufacture another example of a semiconductive photovoltaic layer 130. The horizontal axis is in arbitrary time units (a.t.u.) such as minutes, or periods of several seconds or minutes. The reason for arbitrary time units is that a person ordinarily skilled in the art may vary the duration of process steps by for example varying material flux rates. Similarly to the description of FIGS. 2A to 2C, substrate 110 will have ordinarily been coated with back-contact layer 120 and then heated for this embodiment to about 350° C. for the deposition of semiconductive layer 130 to begin. Similarly to the description for FIGS. 2A to 2C, temperatures ordinarily have an inferior limit marked by segments 312 and 314, with waypoints 313 at 350° C. at end of step ($s_1$) and 315 at 450° C. and about 40 a.t.u. before the end of step ($s_{4,0}$).

FIG. 3B shows a first exemplary sequence of A and B material rates that may form the ABC material of layer 130 as a function of time given in arbitrary time units (a.t.u.). Material C and additional dopant materials are not represented. In this example, material A is represented by curve 320 for Cu and material B by a combination of In (curve 310) and Ga (curve 330). Table 3 combines temperature and deposition data of FIGS. 3A and 3B.

TABLE 3

Example material deposition sequence of FIGS. 3A and 3B

| | Period [a.t.u.] | Temp. [° C.] | Material Deposition Rate [Å/s] | | |
|---|---|---|---|---|---|
| Step | Begin → End | Begin → End | A: Cu | B: In | B: Ga |
| $s_1$ | 0 → 20 | (200-~350) → 350 | 0 | 3.7 | 1.1 |
| $s_2$ | 20 → 28 | 350 → ~450 | 2.6 | 0 | 0.4 |
| $s_{3,0}$ | 28 → 36 | ~450 → ~450 | 1.3 | 0 | 0.5 |
| $s_{4,0}$ | 36 → 44 | ~450 → 450 | 2.6 | 0 | 0.1 |
| $s_5$ | 44 → 62 | 450 → 450 | 0 | 0.9 | 0.3 |

FIG. 3C shows a second exemplary sequence of A and B material rates that may form the ABC material of layer 130 as a function of time in minutes. The duration of steps ($s_1$) to ($s_5$) is represented at the top of the graph. Material C is not represented but is provided as Se element provided at a rate of about 30 Å/s at least until the end of step ($s_5$) and ordinarily during the entire deposition process. In this example, material A is represented by curve 320 for Cu and material B by a combination of In (curve 310) and Ga (curve 330). In a more general description where steps ($s_{3,r}$) and ($s_{4,r}$) are repeated up to a number R times, and where r is a number from 0 to R that identifies each step ($s_{3,r}$) and ($s_{4,r}$), the total amount of Ga deposited over steps ($s_2$), ($s_{3,r}$), and ($s_{4,r}$) is ordinarily comprised between 10% and 50% of the total amount of Ga deposited over the entire process. Furthermore, the total amount of Ga deposited over steps ($s_{3,r}$) is ordinarily comprised between 10% and 25% of the total amount of Ga deposited over the entire process. Curve 350 indicates the deposition rate of alkaline NaF material, in this example near the end of the deposition process at a rate of about 0.3 Å/s from about T0+68 to about T0+88, where T0 is the time when the process begins and times are in minutes. Table 4 lists waypoints in the second exemplary deposition sequence. Timings for steps ($s_1$) to ($s_5$) are indicative and a person ordinarily skilled in the art will infer that there is some cross-over between steps caused by the time needed to adjust the source temperatures used for material deposition.

TABLE 4

Example material deposition sequence of FIGS. 3A and 3C

| | | | Material Deposition Rate [Å/s] | | |
|---|---|---|---|---|---|
| Step | Time [min] | Temp. [° C.] | A: Cu | B: In | B: Ga |
| $s_1$ | 0 | 350 | 0 | 3.5 | 1.1 |
| | 19 | 350 | 0 | 3.5 | 0.95 |
| $s_2$ | 21 | 350 | 2.1 | 0.15 | 0.15 |
| | 28 | 450 | 2.1 | 0.15 | 0.15 |
| $s_{3,0}$ | 29 | 450 | 2.1 | 0.15 | 0.6 |
| | 37 | 450 | 2.1 | 0.15 | 0.6 |
| $s_{4,0}$ | 38 | 450 | 2.1 | 0.15 | 0.15 |
| | 44 | 450 | 2.1 | 0.15 | 0.15 |
| $s_5$ | 46 | 450 | 0 | 0.9 | 0.35 |
| | 62 | 450 | 0 | 0.9 | 0.45 |
| | 62.01 | 450 | 0 | 0 | 0 |

FIGS. 4A and 4B show a third deposition example to manufacture a first exemplary embodiment. Similarly to FIG. 3A, FIG. 4A is a graph of substrate temperatures 400 during a material deposition process that lasts about 100 minutes. With the help of the baseline deposition process of FIGS. 4A and 4B, a person skilled in the art is able to manufacture CIGS photovoltaic cells with independently accredited photovoltaic conversion efficiency greater than 17%. Although increases and decreases in material deposition rates are represented in FIG. 4B as linear ramps, a person ordinarily skilled in the art will infer that small variations and steeper gradient transitions are also possible for a successful material deposition. Additionally, the steep linear transition ramps depicted in FIG. 4B result from hardware limitations of the material deposition system used and a person ordinarily skilled in the art will infer that such limitations enable the depicted process to remain within the scope of the disclosure's method. Curves 420, 410, and 430 describe the deposition rates of Cu, In, and Ga, respectively. Curve 430 is characterized by a central notch or hump, hereinafter referred to as a "hump" 405 where, following an initial decrease, the deposition rate of Ga is increased for a period of time. FIG. 4B therefore only represents the deposition sequence for A and B materials as well as alkaline NaF dopant material. Not shown in FIG. 4B is the deposition over the entire process duration of Se, a C material, at a rate of about 30 Å/s. Curve 450 describes the deposition rate of alkaline NaF material, in this example near the end of the deposition process at a rate of about 0.3 Å/s from about T0+68 to about 10+88, where T0 is the time when the process begins and times are in minutes. Table 5 lists waypoints in the deposition sequence to manufacture said first exemplary embodiment according to the method depicted in FIGS. 4A and 4B.

TABLE 5

Example material deposition sequence of FIGS. 4A and 4B

| | | Material Deposition Rate [Å/s] | | |
|---|---|---|---|---|
| Time [min] | Temp. [° C.] | A: Cu | B: In | B: Ga |
| 0 | 350 | 0 | 3.2 | 1 |
| 18 | 350 | 0 | 3.2 | 0.85 |
| 24 | 350 | 2.17 | 0.2 | 0.20 |
| 30 | 450 | 2.17 | 0.2 | 0.50 |
| 36 | 450 | 2.17 | 0.2 | 0.50 |
| 42 | 450 | 2.17 | 0.2 | 0.2 |
| 48 | 450 | 0 | 1 | 0.35 |
| 63 | 450 | 0 | 1 | 0.45 |
| 63.01 | 450 | 0 | 0 | 0 |

Figure 5A:
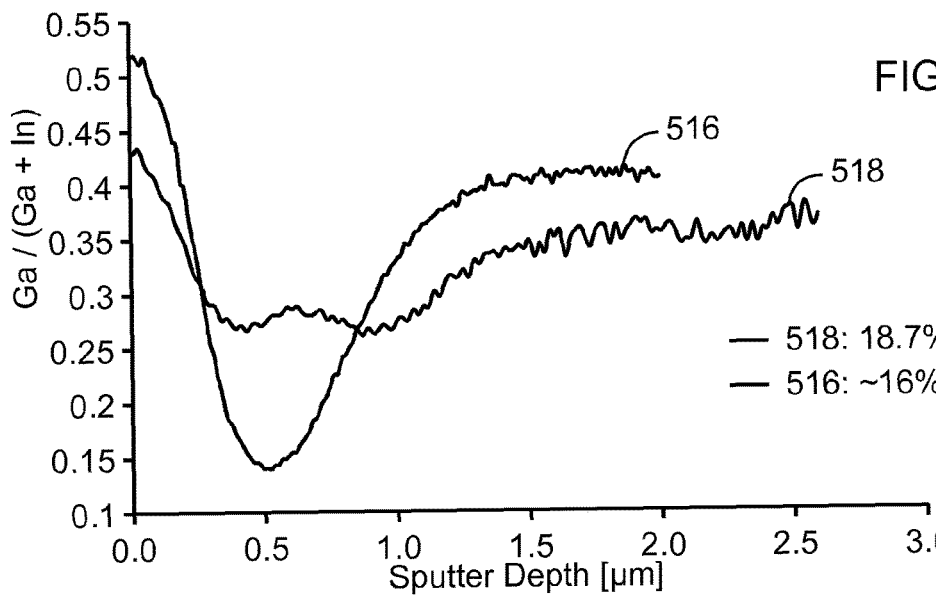
FIGS. 5A, 5B, and 5C are graphs of, respectively, raw data, smoothed data, and exemplary data showing material ratios as a function of sputter depth for an absorber layer resulting from a deposition method based on prior art compared to an absorber layer embodiment manufactured using the inventive method and variations thereof (FIG. 5C).
Figure 5B:
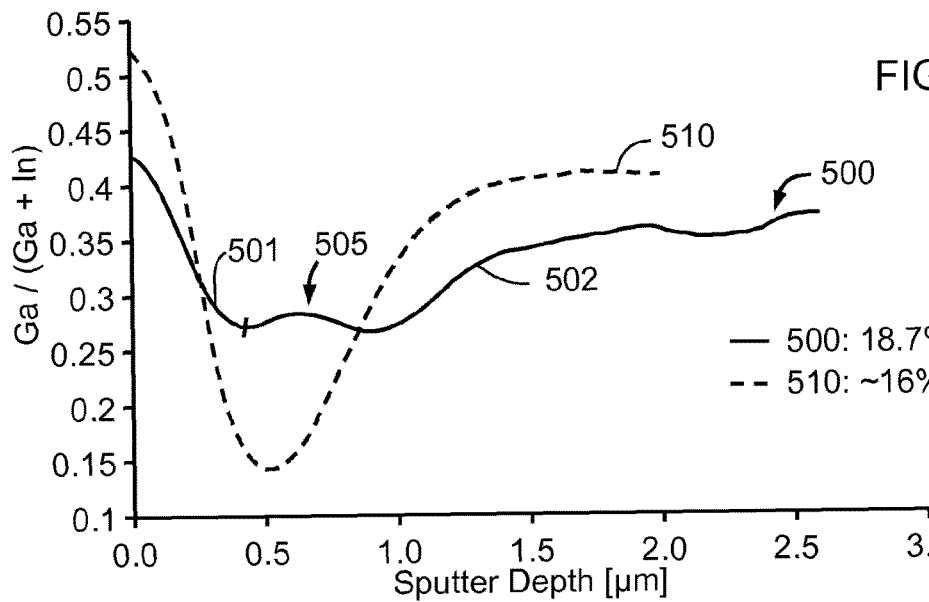
Figure 5C:
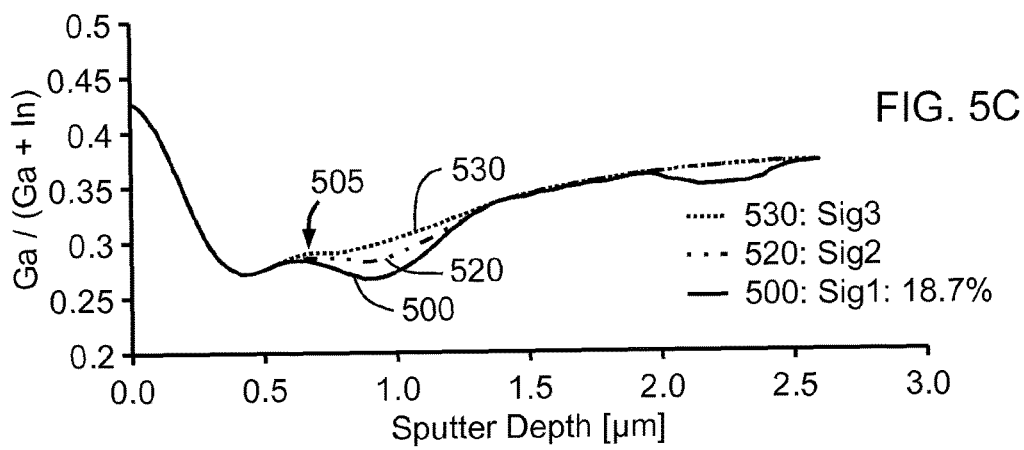
Figure 6A:
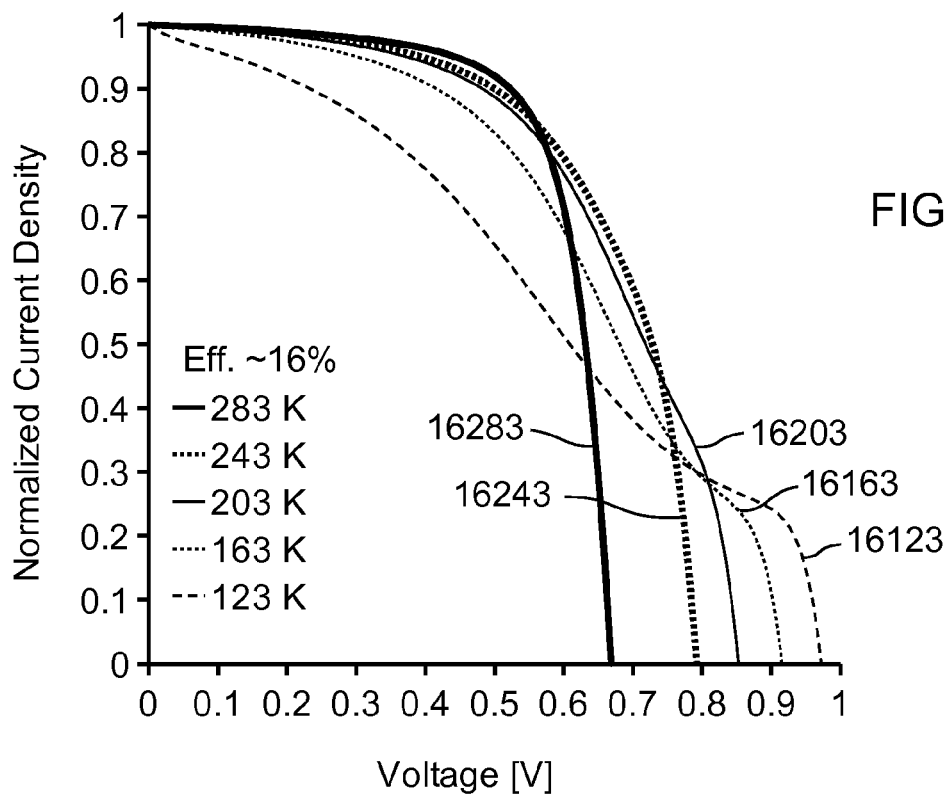
FIGS. 6A and 6B are graphs showing current density vs. voltage over several temperatures for photovoltaic cells having a photovoltaic efficiency of about 16% and 18.7%, respectively.
Figure 6B:
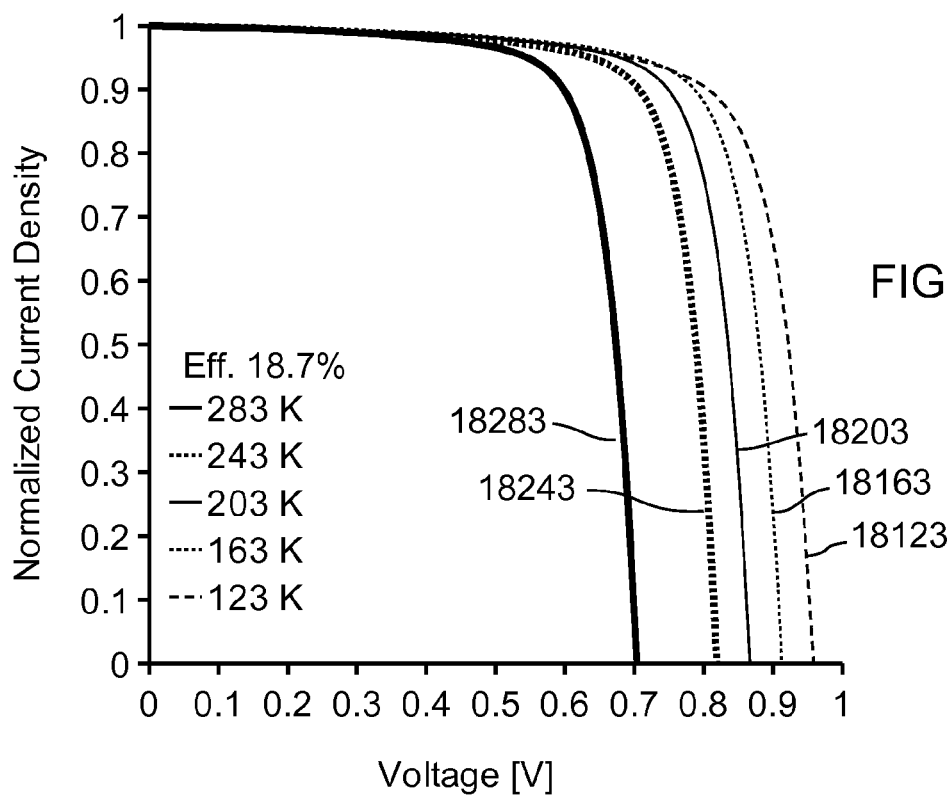

FIGS. 5A-5C, 6A-6B, and 7 show data associated with two methods that enable differentiation between a photovoltaic device manufactured using the methods described in FIGS. 2A to 4B and a photovoltaic device manufactured using the methods described in prior art. FIGS. 5A-5C correspond to what usually is an invasive method and are based on an analysis of the relative composition of materials along the thickness of absorber layer 130. FIGS. 6A, 6B, and 7 correspond to a non-invasive method based on an analysis of photovoltaic conversion of photovoltaic cells over a range of temperatures.

FIGS. 5A and 5B are sputter depth profiling graphs showing the relative amount of Ga to Ga+In, i.e. Ga/(Ga+In), versus sputter depth for two types of photovoltaic cells. The graph of FIG. 5A is obtained by progressive erosion of matter at the surface of a photovoltaic cell's absorber layer 130, i.e. the CIGS layer, using an ion gun and then measuring the composition of sputtered material using secondary ion mass spectroscopy. Curve 518 presents raw data for an 18.7% efficiency photovoltaic cell with a CIGS absorber layer thickness of about 2.8 μm deposited according to the method described in relation to FIGS. 4A-4B. Curve 516 presents raw data for an about 16% efficiency (15.1% without anti-reflective coating) photovoltaic cell with a CIGS absorber layer deposited with a method that has similarities with the methods described in the prior art in U.S. Pat. No. 5,441,897 and in U.S. Pat. No. 6,258,620. Secondary ion mass spectroscopy depth profiling data for curves 518 and 516 was obtained with an Atomika 6500 ion microprobe system using $O_2^+$ primary ions. For curve 518 the system was set to 12 kV ion energy, 2.0 μA, a 500×500 μm² spot size, a monitored area of 4% of the crater center corresponding to 20%×20% blanking of each crater coordinate. For curve 516 the system was set to 14 kV ion energy, 2.3 μA, a 600×600 μm² spot size, a monitored area of 4% of the crater center corresponding to 20%×20% blanking of each crater coordinate.

FIG. 5B is similar to FIG. 5A where curve 500 is obtained by smoothing the raw data of curve 518 and curve 510 is obtained by smoothing the raw data of curve 516. Smoothing of raw data was done using a LOESS method (smoothing parameter α=0.7). Curve 500 therefore corresponds to that of a cell with a photovoltaic conversion efficiency of 18.7% and curve 510 to that of an about 16% efficiency cell manufactured using a prior art method.

Curve 500 is discussed by considering two curve regions 501 and 502. The first curve region 501 starts from the light-exposed side (sputter depth=0) of absorber layer 130 and continues as long as the Ga/(Ga+In) ratio decreases to a first minimum. Region 501 is called the front grading region of curve 500. The second curve region 502 starts from said first minimum and extends to the back side. Region 502 is called the back grading region of curve 500. The light-exposed surface value (sputter depth=0) corresponds to a maximum for Ga/(Ga+In) of about 0.43. A characteristic signature revealed in sputter depth profile 500 is the relatively high Ga/(Ga+In) value of about 0.27 at which profile 500 reaches its first minimum beneath the surface of absorber layer 130. There is therefore a difference of 0.16 between maximum and first minimum. On the other hand, sputter depth profile 510 has a light-exposed surface value corresponding to a maximum for Ga/(Ga+In) of about 0.52 but the characteristic signature revealed in sputter depth profile 510 shows that Ga/(Ga+In) reaches a first minimum value (which is here the curve's absolute minimum) of about 0.14 at a depth of about 0.5 μm beneath the surface of absorber layer 130. There is therefore a difference of 0.38 between maximum and first minimum. Comparing the gap between maximum and first minimum for curves 500 and 510, i.e. 0.16 and 0.38, there is an absolute max-min gap difference between said curves of 0.38−0.16=0.22, i.e. a nearly 58% gap difference between curves 500 and 510. The reduced gap of curve 500 compared to that of curve 510 is beneficial for increased photovoltaic conversion efficiency and is the result of the advantageous deposition method presented in FIGS. 2A-2B, 3A-3B and demonstrated in FIGS. 4A-4B where a more optimal band gap grading is produced by careful dosage of In and Ga throughout the process.

Another point of interest in the characteristic signature found in cells produced using the advantageous method of FIGS. 2A-4B is the slope of the initial strongly descending part of curve 500, also known as the front grading segment or region, from approximate coordinates (0, 0.43) to (0.4, 0.265). The more or less linear segment of the front grading segment of curve 500 has a descending slope of about $0.64\times10^{-6}$ m$^{-1}$. In comparison, the more or less linear segment of the front grading segment of curve 510 has a steeper descending slope of about $1.18\times10^{-6}$ m$^{-1}$. The more gradual slope of the front grading segment 501 combined with the aforementioned reduced gap of curve 500 is beneficial for increased photovoltaic conversion efficiency.

A further point of interest in the characteristic signature found in cells produced using the advantageous method of FIGS. 2A-4B is the presence in curve 500 of a hump 505 located within region 502 and more precisely within the part, hereby called the back grading segment or region, extending from the first minimum till about halfway to the back side of the absorber layer. The width of hump 505 is characterized by the presence of a first inflection point in the curve on the light-exposed side of the hump and a second inflection point in the curve on the back side of the hump. Hump 505 is especially visible in curve 500 due to a wide low-level part that is markedly low from approximate coordinates (0.235, 0.28) to (1.1, 0.28). Hump 505 results from hump 405 in FIG. 4B. Curve 500 also exhibits a generally broad and relatively low-level segment from said first minimum to the back side maximum. The so-called back grading segment extending from approximate coordinates (0.4, 0.265) to about (2.0, 0.35) forms a rather extended and gradual slope from minimum to back side maximum. An extended gradual slope from minimum to the back side maximum may be beneficial for increased photovoltaic conversion efficiency. Compared to curve 500, the back grading segment of curve 510 is much steeper and much higher, thereby forming a narrow minimum.

FIG. 5C is a sputter depth profiling graph comparing signature curves 500 for Sig1, 520 for Sig2, 530 for Sig3, obtainable by applying variations to the inventive method. Curve 500 of FIG. 5C is the same as curve 500 of FIG. 4B. Curves 500, 520, 530 all include, starting from the light-exposed side of absorber layer 130, a front grading region followed by a first minimum itself followed by a characteristic hump 505 comprised with a back grading region. Hump 505 results from the deposition process method of this disclosure exemplified by FIGS. 2A to 4B. Curve 500 corresponds to the method of FIGS. 4A-4B that provides 18.7% efficiency photovoltaic cells. Hump 505 is visible in curves 500, 520, and 530. Hump 505 results from hump 405 visible in FIG. 4B. Curve 520 is similar to curve 500 but with a less pronounced hump 505 due to a slightly raised second minimum at the back side of hump 505 when compared to curve 500. The common characteristic of hump 505 in curves 500, 520, 530 is that the hump is located, starting from the light-exposed side of any of curves 500, 520, 530, between said first minimum and the light-exposed half side of the back grading region of curves 500, 520, 530. Curve 520 is obtained by applying the method of FIGS. 2A to 4B but increasing slightly the Ga/(Ga+In) ratio during deposition, for example in reference to FIG. 4B between T0+25 and T0+41. Curve 530 represents the profile obtainable with a further variation to the method of FIGS. 4A-4B so as to design a uniform and gradually ascending back grading segment from the profile's minimum to the back's maximum. Curve 530 is obtained by applying the method of FIGS. 4A-4B with the difference that the Ga/(Ga+In) ratio is increased more than in curve 520, for example in reference to FIG. 4B during the deposition stage between T0+25 and T0+41, said deposition stage including step $s_{3,0}$.

The theory underlying the invention is advantageous in that it enables a person skilled in the art to use the method and its examples to design a device having improved photovoltaic characteristics. A person skilled in the art can use 5 or more steps to generate an absorber layer 130 with improved front grading and back grading regions 501 and 502, respectively. Steps $(s_{3,r})$ and $(s_{4,r})$ may therefore be used and repeated to generate one or more humps 505 to design an improved back grading region 502 resembling that depicted by curve 500 or further improved resembling that depicted by said back grading region of curves 520 and 530. Especially careful use of steps $(s_2)$ to $(s_5)$ will also enable a person skilled in the art to manufacture a device with the required front grading region 501.

The invention is also advantageous in that sputter profiling analysis may enable a person skilled in the art to differentiate between a device manufactured using the inventive method and a device manufactured using another method, the presence of at least one hump 505 in the sputter profiling graph being a possible signature of the disclosure's method.

FIGS. 6A and 6B enable a comparison of photovoltaic conversion performance between two photovoltaic devices operating over a range of temperatures. FIG. 6A summarizes tests done with the photovoltaic cell of about 16% efficiency presented in FIG. 5A-5B and manufactured using a method similar to that described in prior art. Curves 16283, 16243, 16203, 16163, and 16123 plot normalized current density as a function of voltage at device temperatures of 283 K, 243 K, 203 K, 163 K, and 123 K, respectively. FIG. 6B summarizes tests done with the photovoltaic cell of 18.7% efficiency presented in FIGS. 5A-5C and manufactured using the inventive method as described in relation to FIGS. 4A-4B. Curves 18283, 18243, 18203, 18163, and 18123 plot normalized current density as a function of voltage at device temperatures of 283 K, 243 K, 203 K, 163 K, and 123 K, respectively. FIG. 6A shows that as the 16%-efficiency device's temperature is decreased from 283 K to 123 K, the normalized current density vs. voltage curves undergo a shape deformation via the presence of an inflection point for temperatures below 243 K. A consequence of this deformation is a reduction in photovoltaic power at the maximum power point as temperature decreases from 243 K to 123 K. Conversely, FIG. 6B shows that as the 18.7% efficiency device's temperature is decreased from 283 K to 123 K, the normalized current density vs. voltage curves undergo no deformation. A consequence of this uniformity is an increase in photovoltaic power at the maximum power point as temperature decreases from 283 K to 123 K.

FIG. 7 is a graph showing fill factor as a function of temperature for the 16% and 18.7% efficiency cells studied in FIGS. 6A and 6B, respectively. Fill factor (FF) is defined as:

$$FF=(V_{MP} \times I_{MP})/(V_{OC} \times I_{SC}),$$

where $V_{MP}$ is voltage at maximum power point, $I_{MP}$ is current at maximum power point, $V_{OC}$ is open-circuit voltage, and $I_{SC}$ is short-circuit current. Curve 710 for the about 16% efficiency cell shows how decreasing device temperature from 283 K to 123 K induces a decrease in FF from 0.72 to 0.34. Curve 700 for the 18.7% efficiency cell shows how decreasing device temperature from 298 K to 123 K causes almost no variation in FF with end point values of about 0.76 and maximum intermediate values of 0.78.

An analysis of photovoltaic conversion performance across a range of device temperatures may therefore advantageously enable a person skilled in the art to make a preliminary evaluation as to whether a device 100, especially if it is flexible and manufactured on a substrate requiring relatively low deposition temperatures below 550° C., comprises an absorber layer 130 that was possibly manufactured using the inventive method.

FIGS. 8A and 8B are graphs that enable to compare photovoltaic performance characterization at a device temperature of 298 K for the 18.7% efficiency photovoltaic cell manufactured according to the invention using the method described in FIGS. 4A-4B with that of an about 16% efficiency device manufactured using a prior art method. Curves 800 and 805 in FIGS. 8A and 8B are based on independently certified measurements made by the Fraunhofer Institute for Solar Energy Systems ISE of said 18.7% efficiency photovoltaic cell. Curve 800 in FIG. 8A, known either as an I-V or a J-V curve, plots current density as a function of voltage. It is characterized by an open-circuit voltage $V_{OC}$ of 711.9 mV, a short-circuit current density of 34.75 mA/cm$^2$, a fill factor FF of 75.75%, a power at maximum power point $P_{MPP}$ of 10.91 mW, a voltage at maximum power point $V_{MPP}$ of 601.5 mV, a current density at maximum power point $J_{MPP}$ of 31.15 mA/cm$^2$, and a total area A of 0.5824 cm$^2$. This results in a maximum power point of 18.74 mW/cm$^2$ at 601.5 mV and 31.15 mA/cm$^2$. Curve 810 is representative of an about 16% efficiency device manufactured using a prior art method. Curve 810 demonstrates a lower voltage over a similar current density range in comparison to curve 800, with an open-circuit voltage of about 0.6 V. Curve 805 in FIG. 8B plots photovoltaic cell external quantum efficiency (EQE) as a function of illumination wavelength. Of interest is that the top of curve 805 is relatively flat and extended at an EQE level of about 90% for a wavelength range extending from about 540 nm to about 880 nm. The fact that said wavelength range of curve 805 is above an EQE level of 90% shows that losses over this range amount to less than 10%. Another point of interest is the steep and extended descending slope of curve 805 between wavelengths of 1020 nm and 1100 nm, said slope being of about −0.688%/nm. On the other hand, curve 815 is a characteristic EQE vs. wavelength curve for prior art with a comparatively shallower descending slope for wavelengths comprised between 1050 nm and 1150 nm, said slope being of about −0.433%/nm.

Provided a photovoltaic device, especially a flexible photovoltaic device manufactured on a substrate requiring relatively low deposition temperatures below 550° C., FIGS. 8A and 8B may enable a person skilled in the art trying to determine whether the device was manufactured using the inventive method of this disclosure, and advantageously to decide whether to conduct further characterization tests such as those associated to FIGS. 6A, 6B, 7, and 9, and more invasively 5A and 5B.

FIG. 9 is a graph showing X-ray diffraction intensity of the dominant (220)/(240) reflections vs. scattering angle for two photovoltaic cells. Curve 900 shows X-ray diffraction for the 18.7% efficiency photovoltaic cell manufactured according to the invention using the method described in FIGS. 4A and 4B. Curve 910 uses the same non-invasive method to analyze the photovoltaic cell of about 16% efficiency presented in FIG. 5A with curve 516 and manufactured using a method similar to that described in prior art. $CuInSe_2$ and $CuGaSe_2$ have different lattice constants and curves 900 and 910 correspond to the graded Ga/(Ga+In) profiles revealed in curves 500 and 510 in FIG. 5B. Curve 900 shows a peak that is substantially narrower at its base than that of curve 910. This indicates that the range of Ga/(Ga+In) grading across the thickness of the absorber layer is narrower for the inventive 18.7% efficiency cell than for the about 16% efficiency prior art cell. Furthermore, curve 910 exhibits a relatively wide shoulder for 2θ between about 44.4 and 44.8 which corresponds to the relatively Ga-poor region visible in curve 510 of FIG. 5B at sputter depths between about 0.3 μm and 0.8 μm. For the inventive 18.7% efficiency photovoltaic cell, the full width at quarter maximum 905 measured from the base of the curve 900 of X-ray diffraction intensity of the dominant (220)/(240) reflections vs. 2θ scattering angle has a width of about 0.54°. For the about 16% efficiency prior art photovoltaic cell, the full width at quarter maximum 915 measured from the base of the curve 910 of X-ray diffraction intensity of the dominant (220)/(240) reflections vs. 2θ scattering angle has a width of about 0.78°.

The X-ray diffraction analysis method presented in FIG. 9 therefore presents an advantageous method to non-invasively suggest whether a photovoltaic device manufactured at temperatures below about 600° C. was manufactured using the inventive method described in this disclosure. The X-ray diffraction analysis method may therefore be used advantageously prior to more invasive methods such as a sputter depth profiling analysis as presented in FIGS. 5A to 5C.

In summary, the disclosed method presents solutions to several problems encountered when manufacturing thin-film photovoltaic devices at substrate temperatures below 550° C. and so that said devices have conversion efficiencies that are comparable to thin-film devices manufactured at substantially higher temperatures or to those based on more conventional silicon wafer technology. The method offers solutions to manufacture photovoltaic devices with advantages over prior art by: 1) enabling the design of a characteristic Ga/(Ga+In) curve by a process containing steps that can be iterated to generate the composition needed for high efficiency, 2) requiring less energy than required in the prior art, 3) offering a broader range of possible substrates such as plastic to produce devices with higher photovoltaic efficiency than possible in the prior art, 4) avoiding having to use metallic substrates and their associated preliminary surface treatments, 5) enabling the use of plastics such as polyimide, the smoothness of which is beneficial for manufacturing highly efficient photovoltaic thin-films, and 6) through the use of flexible substrates, enabling low-cost and low-energy roll-to-roll production of highly efficient photovoltaic devices.

Another aspect of the invention is a photovoltaic device produced using the method. Said photovoltaic device exhibits photovoltaic characteristics with a marked improvement in photovoltaic conversion efficiency over prior art characterized by: 1) improved absorber layer front grading and photovoltaic characteristics within the first micrometer at the light exposed side of the absorber layer, 2) a higher fill factor and open circuit voltage $V_{OC}$ than prior art devices manufactured at similar temperatures, 3) improved layer interface properties. Analyzing the device, in the way set out in this disclosure, presents solutions to: 1) suggest whether the device was manufactured according to the method, 2) identify how the device differs from prior art, and 3) suggest how to use the method to manufacture devices of equivalent or higher photovoltaic conversion efficiency.

The invention claimed is:

1. A method of fabricating at least one absorber layer for thin-film photovoltaic devices, which absorber layer is made of an ABC chalcogenide material, wherein A represents one or more of copper (Cu) and silver (Ag), B represents one or more of indium (In), gallium (Ga), and aluminum (Al), and C represents one or more of sulfur (S), selenium (Se), and tellurium (Te), wherein said absorber layer is deposited onto a back-contact layer disposed on a substrate, said method comprising the following sequential steps ($s_1$) to ($s_5$), wherein the two steps ($s_{3,r}$) and ($s_{4,r}$) are executed at least once and sequentially repeated from zero up to a number R times, wherein R is an integer greater than or equal to 1 and r is a repeat counting index having a value from 0 to R that identifies the successive steps ($s_{3,r}$) and ($s_{4,r}$), and wherein the temperature of substrate from steps ($s_2$) to ($s_5$) is greater than 350° C.:

$s_1$. depositing at least one B element onto the back-contact layer of said substrate in an amount that is greater than 10% and less than 90% of the total amount of required B elements at the end of the deposition process, such deposition being done in the presence of at least one C element;

$s_2$. depositing an initial amount of at least one A element in combination with at least one B element and in the presence of at least one C element, with a ratio A/B of the atomic deposition rates of elements A and B such that:

$A/B > 1$, and the atomic ratio A/B of the total deposited elements A and B at the end of step ($s_2$) is:

$(1/(3+2R))^2 < A/B < 1.0;$ $s_{3,r}$. depositing at least one A element in combination with at least one B element and in the presence of at least one C element, with a ratio $A_r/B_r$ of the atomic deposition rates of elements A and B such that:

$A_r/B_r$ is 1/1.2 times less than that of $A_r/B_r$ in the previous step, and the atomic ratio A/B of the total deposited elements A and B at the end of the step ($s_{3,r}$) is:

$$((2+2r)/(3+2R))^2 < A/B < 1+3((1+2r)/(2+2R))^{1/2};$$

$s_{4,r}$. depositing at least one A element in combination with at least one B element and in the presence of at least one C element, with a ratio $A_r/B_r$ of the atomic deposition rates of elements A and B such that;

$A_r/B_r$ is at least 1.2 times greater than that of $A_r/B_r$ in the previous step, and the atomic ratio A/B of the total deposited elements A and B at the end of the step ($s_{4,r}$) is:

$$((3+2r)/(3+2R))^2 < A/B < 1+3((1+r)/(1+R))^{1/2};$$ and $s_5$. depositing an additional amount of at least one B element in the presence of at least one C element onto the partially completed absorber layer, thereby changing the atomic ratio A/B of the total deposited elements A and B elements at the end of step ($s_5$) to:

$$0.6 < A/B < 0.99.$$

2. The method according to claim 1, where at least one C element is added to the absorber layer before, between, or after any of steps ($s_1$), ($s_2$), ($s_{3,r}$), ($s_{4,r}$), and ($s_5$).

3. The method according to claim 1, wherein the substrate temperature is greater than 350° C. and less than 550° C. for steps ($s_2$), ($s_{3,r}$), ($s_{4,r}$), and ($s_5$).

4. The method according to claim 1, wherein the substrate temperature where material is deposited during step ($s_1$) is greater than 200° C. and less than 450° C., and the substrate temperature where material is deposited is then increased during any of, or a combination of, steps ($s_2$), ($s_{3,r}$), and ($s_{4,r}$) to reach a temperature that is greater than 350° C. and less than 550° C.

5. The method according to claim 1, wherein the substrate temperature where material is deposited during step ($s_1$) is about 350° C., then the substrate temperature where material is deposited is increased during step ($s_2$) to reach a temperature that is about 450° C. in step ($s_{3,r}$), where r=0; and then maintained substantially constant until the end of steps ($s_{4,r}$) and ($s_5$), where r=R.

6. The method according to claim 1, where A represents element Cu, B represents elements In and/or Ga, and C represents element Se.

7. The method according to claim 1, wherein the deposited B element(s) comprise Ga and wherein the total amount of Ga deposited over steps ($s_2$), ($s_{3,r}$), and ($s_{4,r}$) is comprised between 10% and 50% of the total amount of Ga deposited over the entire process.

8. The method according to claim 1, wherein the deposited B element(s) comprise Ga and wherein the total amount of Ga deposited over steps ($s_{3,r}$) is comprised between 10% and 25% of the total amount of Ga deposited over the entire process.

9. The method according to claim 1, wherein deposition steps ($s_1$) to ($s_5$) of claim 1 correspond to the following respective step sequence of material deposition rates within a ±20% margin:

$s_1$. depositing In at a rate of 3.5 Å/s and Ga starting at a rate of 1.1 Å/s and decreasing progressively to 0.95 Å/s;

$s_2$. depositing Cu at a rate of 2.1 Å/s, In at a rate of 0.15 Å/s, and Ga at a rate of 0.15 Å/s;

$s_{3,0}$. depositing Cu at a rate of 2.1 Å/s, In at a rate of 0.15 Å/s, and Ga at a rate of 0.6 Å/s;

$s_{4,0}$. depositing Cu at a rate of 2.1 Å/s, In at a rate of 0.15 Å/s, and Ga at a rate of 0.15 Å/s;

$s_5$. depositing In at a rate of 0.9 Å/s and Ga starting at a rate of 0.35 Å/s and increasing progressively to 0.45 Å/s.

10. The method according to claim 1, wherein said sequential steps ($s_1$) to ($s_5$) are followed by a further step where at least one B element is deposited in the presence of at least one C element at a temperature below 350° C. and such that a supplemental layer less than 100 nm thick is deposited.

11. The method according to claim 1, wherein alkaline elements are provided to said absorber layer by any of: said substrate, said back-contact layer, and/or an alkaline containing precursor that is deposited during and/or after the deposition of said absorber layer.

12. A method of forming an absorber layer of a thin-film photovoltaic device comprising:
a) depositing a first region of an absorber layer over a back contact layer that is disposed on a substrate, wherein the first region comprises one or more first elements that are selected from a group consisting of In, Ga, and Al;
b) depositing a second region of the absorber layer over the first region, wherein depositing the second region comprises:
depositing the one or more first elements at a first deposition rate;
depositing one or more second elements at a second deposition rate, wherein the one or more second elements are Cu or Ag; and
maintaining a first deposition rate ratio while depositing the second region, wherein the first deposition rate ratio is a ratio of the second deposition rate to the first deposition rate;
c) depositing a third region of the absorber layer over the second region, wherein the third region of the absorber layer comprises one or more first elements and one of the one or more second elements, and depositing the third region comprises:
depositing the one or more first elements at a third deposition rate;
depositing the one of the one or more second elements at a fourth deposition rate; and
maintaining a second deposition rate ratio while depositing the third region, wherein the second deposition rate ratio is a ratio of the fourth deposition rate to the third deposition rate, and the second deposition rate ratio is less than 0.83 times the first deposition rate ratio; and
d) depositing a fourth region of the absorber layer over the third region, wherein the fourth region of the absorber layer comprises one or more first elements and one of the one or more second elements, and depositing the fourth region comprises:
depositing the one or more first elements at a fifth deposition rate;
depositing the one or more second elements at a sixth deposition rate; and
maintaining a third deposition rate ratio while depositing the fourth region, wherein the third deposition rate ratio is a ratio of the sixth deposition rate to the fifth deposition rate, and the third deposition rate ratio is greater than 1.2 times second ratio.

13. The method of claim 12, further comprising:
e) depositing a fifth region of the absorber layer comprising depositing one or more first elements over the fourth region until a total amount of second elements relative to a total amount of first elements in the first through fifth regions can be expressed as an atomic ratio of greater than 0.6 and less than 0.99.

14. The method of claim 13, further comprising repeating (c) and (d) after performing (d) and before performing (e).

15. The method of claim 13, further comprising adding an alkaline material to at least one of the first through fifth regions, wherein adding the alkaline material comprises providing one or more alkaline materials selected from the group consisting of NaF, NaCl, NaSe, KF, KCl, CsF, and LiF while forming at least one of the first through fifth regions.

16. The method of claim 13, further comprising adding an alkaline material to the absorber layer after the fifth region is deposited.

17. The method of claim 13, further comprising providing one or more of Se, S, or Te while forming at least one of the first through fifth regions.

18. A method of forming an absorber layer of a thin-film photovoltaic device comprising:
a) depositing a first region of the absorber layer over a back contact layer that is disposed on a substrate, wherein the first region comprises In and Ga;
b) depositing a second region of the absorber layer over the first region, wherein depositing the second region comprises:
depositing In and Ga at a first deposition rate, wherein the first deposition rate is a sum of a first In deposition rate and a first Ga deposition rate;
depositing Cu at a second deposition rate; and
maintaining a first deposition rate ratio while depositing the second region, wherein the first deposition rate ratio is a ratio of the second deposition rate to the first deposition rate;
c) depositing a third region of the absorber layer over the second region, wherein depositing the third region comprises:
depositing In and Ga at a third deposition rate, wherein the third deposition rate is a sum of a second In deposition rate and a second Ga deposition rate;
depositing Cu at a fourth deposition rate; and
maintaining a second deposition rate ratio while depositing the third region, wherein the second deposition rate ratio is a ratio of the fourth deposition rate to the third deposition rate, and the second deposition rate ratio is less than 0.83 times the first deposition rate ratio; and
d) depositing a fourth region of the absorber layer over the third region, wherein depositing the fourth region comprises:
depositing In and Ga at a fifth deposition rate, wherein the fifth deposition rate is a sum of a third In deposition rate and a third Ga deposition rate;
depositing Cu at a sixth deposition rate; and
maintaining a third deposition rate ratio while depositing the fourth region, wherein the third deposition rate ratio is a ratio of the sixth deposition rate to the fifth deposition rate, and the third deposition rate ratio is greater than 1.2 times second ratio,
wherein a ratio of the second Ga deposition rate to the second In deposition rate is greater than a ratio of the first Ga deposition rate to the first In deposition rate or a ratio of the third Ga deposition rate to the third In deposition rate.

19. The method of claim 18, further comprising
(e) depositing a fifth region of the absorber layer comprising depositing one or more first elements over the fourth region until a total amount of second elements relative to a total amount of first elements in the first through fifth regions can be expressed as an atomic ratio of greater than 0.6 and less than 0.99.

20. The method of claim 19, further comprising repeating (c) and (d) after performing (d) and before depositing the fifth region.

21. The method of claim 18, further comprising providing one or more of Se, S, and Te during the processes performed in at least one of (a), (b), (c) or (d).

22. The method of claim 18, further comprising adding an alkaline material to at least one of the first through fourth regions, wherein adding the alkaline material comprises providing one or more alkaline materials selected from the group consisting of NaF, NaCl, NaSe, KF, KCl, CsF, and LiF while forming the at least one of the first through fourth regions.

23. The method of claim 19, further comprising adding an alkaline material to absorber layer after performing (e), wherein adding the alkaline material comprises providing one or more alkaline materials selected from the group consisting of NaF, NaCl, NaSe, KF, KCl, CsF, and LiF.

24. The method of claim 18, wherein a temperature of the substrate is maintained at or below 450° C. for (a)-(d).

25. The method of claim 18, wherein the second Ga deposition rate is greater than the second In deposition rate.

26. The method of claim 19, further comprising adding an alkaline material to the absorber layer after performing (e).

27. The method of claim 1, further comprising adding an alkaline material to the absorber layer after after step ($s_5$).

* * * * *